(12) United States Patent
Hao et al.

(10) Patent No.: US 12,060,502 B2
(45) Date of Patent: Aug. 13, 2024

(54) PHASE SEPARATED ARTICLES

(71) Applicant: 3M INNOVATIVE PROPERTIES COMPANY, St. Paul, MN (US)

(72) Inventors: Encai Hao, Woodbury, MN (US); Zhicheng Tian, Woodbury, MN (US); Dong-Wei Zhu, North Oaks, MN (US); Zhaohui Yang, North Oaks, MN (US); James P. Dizio, St. Paul, MN (US); Ying Zhang, Woodbury, MN (US); Junkang J. Liu, Woodbury, MN (US); Kent C. Hackbarth, River Falls, WI (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 675 days.

(21) Appl. No.: 17/057,841

(22) PCT Filed: May 23, 2019

(86) PCT No.: PCT/IB2019/054280
§ 371 (c)(1),
(2) Date: Nov. 23, 2020

(87) PCT Pub. No.: WO2019/224769
PCT Pub. Date: Nov. 28, 2019

(65) Prior Publication Data
US 2021/0198536 A1   Jul. 1, 2021

Related U.S. Application Data

(60) Provisional application No. 62/676,690, filed on May 25, 2018.

(51) Int. Cl.
*C09J 151/08* (2006.01)
*C08F 220/18* (2006.01)
(Continued)

(52) U.S. Cl.
CPC ....... *C09J 151/08* (2013.01); *C08F 220/1808* (2020.02); *C08F 283/12* (2013.01);
(Continued)

(58) Field of Classification Search
CPC ...... H10K 50/844; H10K 50/00; H10K 50/10; H10K 50/868; H10K 50/8426;
(Continued)

(56) References Cited

U.S. PATENT DOCUMENTS

| | | | |
|---|---|---|---|
| 3,890,269 A | 6/1975 | Martin | |
| 4,661,577 A | 4/1987 | Jo Lane | |

(Continued)

FOREIGN PATENT DOCUMENTS

| | | | |
|---|---|---|---|
| CN | 103270618 B | * | 8/2016 |
| CN | 107022315 A | | 8/2017 |

(Continued)

OTHER PUBLICATIONS

Satas, "Handbook of Pressure Sensitive Adhesive Technology", Second Edition, 1989, p. 172.

(Continued)

*Primary Examiner* — Ida M Soward
(74) *Attorney, Agent, or Firm* — Clifton F. Richardson

(57) ABSTRACT

Phase separated articles that include a matrix phase including an acrylate copolymer; and a silicone elastomer phase stably dispersed in the matrix phase are described. The matrix phase may be derived from precursors comprising from 60 to 95 parts by weight of an alkyl acrylate having an alkyl group having 1 to 14 carbon atoms. Methods of forming phase separated articles, and articles including phase separated articles are also described.

24 Claims, 5 Drawing Sheets

(51) Int. Cl.
*C08F 283/12* (2006.01)
*C08L 33/08* (2006.01)
*C09J 11/08* (2006.01)
*C09J 133/08* (2006.01)
*H10K 50/844* (2023.01)
*H10K 50/00* (2023.01)
*H10K 50/10* (2023.01)
*H10K 50/80* (2023.01)
*H10K 50/842* (2023.01)
*H10K 59/10* (2023.01)
*H10K 59/12* (2023.01)

(52) U.S. Cl.
CPC .............. *C08L 33/08* (2013.01); *C09J 11/08* (2013.01); *C09J 133/08* (2013.01); *C09J 151/085* (2013.01); *H10K 50/844* (2023.02); *H10K 50/00* (2023.02); *H10K 50/10* (2023.02); *H10K 50/8426* (2023.02); *H10K 50/868* (2023.02); *H10K 59/10* (2023.02); *H10K 59/12* (2023.02)

(58) Field of Classification Search
CPC ........ H10K 59/10; H10K 59/12; C08L 33/08; C08F 283/12; C08F 283/22; C08F 283/1808; C09J 11/08; C09J 133/08; C09J 151/085
See application file for complete search history.

(56) References Cited

U.S. PATENT DOCUMENTS

| | | | |
|---|---|---|---|
| 5,026,890 A | 6/1991 | Webb | |
| 5,120,781 A | 6/1992 | Johnson, Jr. | |
| 5,214,119 A | 5/1993 | Leir | |
| 5,276,122 A | 1/1994 | Aoki | |
| 5,512,650 A | 4/1996 | Leir | |
| 6,433,931 B1 * | 8/2002 | Fink | B82Y 20/00 359/241 |
| 6,569,521 B1 | 5/2003 | Sheridan | |
| 6,730,397 B2 | 5/2004 | Melancon | |
| 7,078,093 B2 | 7/2006 | Sheridan | |
| 7,371,464 B2 | 5/2008 | Sherman | |
| 7,501,184 B2 | 3/2009 | Leir | |
| 7,705,101 B2 | 4/2010 | Sherman | |
| 8,063,166 B2 | 11/2011 | Sherman | |
| 8,361,632 B2 | 1/2013 | Everaerts | |
| 8,765,881 B2 | 7/2014 | Hays | |
| 2009/0156747 A1 | 6/2009 | Lu | |
| 2011/0071270 A1 | 3/2011 | Hays | |
| 2012/0300300 A1 | 11/2012 | Yasui | |
| 2014/0235742 A1 | 8/2014 | Cho | |
| 2014/0287642 A1 | 9/2014 | Kumar | |
| 2014/0299844 A1 | 10/2014 | You | |
| 2016/0001521 A1 | 1/2016 | Tanaka | |
| 2016/0155967 A1 | 6/2016 | Lee | |
| 2018/0002471 A1 | 1/2018 | Humpal | |

FOREIGN PATENT DOCUMENTS

| | | | | |
|---|---|---|---|---|
| JP | 60197780 A | | 10/1985 | |
| JP | 2006299192 A | * | 11/2006 | ............... C08L 25/16 |
| JP | 2008058929 A | * | 3/2008 | ............... G02B 5/02 |
| JP | 2010265410 A | * | 11/2010 | |
| JP | 2011039590 A | * | 2/2011 | |
| KR | 20160008653 A | * | 1/2016 | ............... B32B 3/02 |
| WO | WO 1995-003354 | | 2/1995 | |
| WO | WO 1996-035458 | | 11/1996 | |
| WO | WO 2011-082069 | | 7/2011 | |
| WO | WO-2012169447 A1 | * | 12/2012 | |
| WO | WO-2013111481 A1 | * | 8/2013 | ......... C08G 18/0823 |
| WO | WO-2014110252 A1 | * | 7/2014 | |
| WO | WO-2014189291 A1 | * | 11/2014 | |
| WO | WO-2016088812 A1 | * | 6/2016 | ............... C08G 77/18 |
| WO | WO 2017019979 A1 | | 2/2017 | |
| WO | WO 2017-058758 | | 4/2017 | |
| WO | WO 2018-204648 | | 11/2018 | |
| WO | WO 2018-204675 | | 11/2018 | |

OTHER PUBLICATIONS

Satas, "Handbook of Pressure Sensitive Adhesive Technology", Second Edition, 1989, p. 173.

International Search Report for PCT International Application No. PCT/IB2019/054280, mailed on Oct. 1, 2019, 3 pages.

* cited by examiner

PHASE SEPARATED ARTICLES

CROSS REFERENCE TO RELATED APPLICATIONS

This application is a national stage filing under 35 U.S.C. 371 of PCT/IB2019/054280, filed May 23, 2019, which claims the benefit of Provisional Application No. 62/676,690, filed May 25, 2018, the disclosure of which is incorporated by reference in its/their entirety herein.

BACKGROUND

Adhesives with specific, desired properties are always necessary for various applications and having various properties. A specific example of this general assertion relates to organic light emitting diodes (OLEDs). One of the biggest advantages of OLED versus liquid crystal displays (LCDs) relates to foldable, curved or flexible versions thereof being possible. With these types of displays, an end user would look at a display image at multiple angles. As such, a solution that could correct the OLED off-angle correction would provide better visual effects. Currently, solutions have been raised, including multi-layer optical films (MOFs) and replicated nanostructures. Such solutions would require additional films and adhesive layers in the OLED stacks having desired properties.

SUMMARY

The present disclosure relates to phase separated articles that include a matrix phase comprising an acrylate functional group; and a silicone elastomer phase stably dispersed in the matrix phase.

The present disclosure also relates to pressure sensitive adhesive articles that include a matrix phase comprising an acrylate functional group; and a silicone elastomer phase stably dispersed in the matrix phase.

The present disclosure also relates to optical articles that include a matrix phase comprising an acrylate functional group; and a silicone elastomer phase stably dispersed in the matrix phase.

The present disclosure also relates to methods of forming an adhesive layer, the method including copolymerizing functionalized silicone elastomer, acrylate functional group containing monomers, initiator, and an optional compatibilizer in solvents to form a solution polymer coating composition, forming a film by coating the solution polymer on a carrier substrate; and drying the film to form an adhesive layer.

The present disclosure also relates to methods of controlling optical properties of a pressure sensitive adhesive layer, the method including copolymerizing functionalized silicone elastomer, acrylate functional group containing monomers, initiator, and a compatibilizer in solvents to form a solution polymer coating composition, wherein the identity of the compatibilizer, one or more properties of the compatibilizer, the quantity of the compatibilizer, or a combination thereof can be chosen in order to control the optical properties of the pressure sensitive adhesive.

All scientific and technical terms used herein have meanings commonly used in the art unless otherwise specified. The definitions provided herein are to facilitate understanding of certain terms used frequently herein and are not meant to limit the scope of the present disclosure.

Definitions

The terms "a", "an", and "the" are used interchangeably with "at least one" to mean one or more of the elements being described.

The term "alkenyl" refers to a monovalent group that is a radical of an alkene, which is a hydrocarbon with at least one carbon-carbon double bond. The alkenyl can be linear, branched, cyclic, or combinations thereof and typically contains 2 to 20 carbon atoms. In some embodiments, the alkenyl contains 2 to 18, 2 to 12, 2 to 10, 4 to 10, 4 to 8, 2 to 8, 2 to 6, or 2 to 4 carbon atoms. Exemplary alkenyl groups include ethenyl, n-propenyl, and n-butenyl.

The term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl.

The term "alkylene" refers to a divalent group that is a radical of an alkane. The alkylene can be straight-chained, branched, cyclic, or combinations thereof. The alkylene often has 1 to 20 carbon atoms. In some embodiments, the alkylene contains 1 to 18, 1 to 12, 1 to 10, 1 to 8, 1 to 6, or 1 to 4 carbon atoms. The radical centers of the alkylene can be on the same carbon atom (i.e., an alkylidene) or on different carbon atoms.

The term "alkoxy" refers to a monovalent group of formula —OR where R is an alkyl group.

The term "alkoxycarbonyl" refers to a monovalent group of formula —(CO)OR where R is an alkyl group and (CO) denotes a carbonyl group with the carbon attached to the oxygen with a double bond.

The term "aralkyl" refers to a monovalent group of formula —$R^a$—Ar where $R^a$ is an alkylene and Ar is an aryl group. That is, the aralkyl is an alkyl substituted with an aryl.

The term "aralkylene" refers to a divalent group of formula —$R^a$—$Ar^a$— where $R^a$ is an alkylene and $Ar^a$ is an arylene (i.e., an alkylene is bonded to an arylene).

The term "aryl" refers to a monovalent group that is aromatic and carbocyclic. The aryl can have one to five rings that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

The term "arylene" refers to a divalent group that is carbocyclic and aromatic. The group has one to five rings that are connected, fused, or combinations thereof. The other rings can be aromatic, non-aromatic, or combinations thereof. In some embodiments, the arylene group has up to 5 rings, up to 4 rings, up to 3 rings, up to 2 rings, or one aromatic ring. For example, the arylene group can be phenylene.

The term "aryloxy" refers to a monovalent group of formula —OAr where Ar is an aryl group.

The term "carbonyl" refers to a divalent group of formula —(CO)— where the carbon atom is attached to the oxygen atom with a double bond.

The term "halo" refers to fluoro, chloro, bromo, or iodo.

The term "haloalkyl" refers to an alkyl having at least one hydrogen atom replaced with a halo. Some haloalkyl groups are fluoroalkyl groups, chloroalkyl groups, or bromoalkyl groups.

The term "heteroalkylene" refers to a divalent group that includes at least two alkylene groups connected by a thio, oxy, or —NR— where R is alkyl. The heteroalkylene can be linear, branched, cyclic, or combinations thereof and can include up to 60 carbon atoms and up to 15 heteroatoms. In some embodiments, the heteroalkylene includes up to 50 carbon atoms, up to 40 carbon atoms, up to 30 carbon atoms, up to 20 carbon atoms, or up to 10 carbon atoms. Some heteroalkylenes are polyalkylene oxides where the heteroatom is oxygen.

The term "oxalyl" refers to a divalent group of formula —(CO)—(CO)— where each (CO) denotes a carbonyl group.

The terms "oxalylamino" and "aminoxalyl" are used interchangeably to refer to a divalent group of formula —(CO)—(CO)—NH— where each (CO) denotes a carbonyl.

The term "aminoxalylamino" refers to a divalent group of formula —NH—(CO)—(CO)—NR$^d$— where each (CO) denotes a carbonyl group and R$^d$ is hydrogen, alkyl, or part of a heterocyclic group along with the nitrogen to which they are both attached. In most embodiments, R$^d$ is hydrogen or alkyl. In many embodiments, R$^d$ is hydrogen.

The terms "polymer" and "polymeric material" refer to both materials prepared from one monomer such as a homopolymer or to materials prepared from two or more monomers such as a copolymer, terpolymer, or the like. Likewise, the term "polymerize" refers to the process of making a polymeric material that can be a homopolymer, copolymer, terpolymer, or the like. The terms "copolymer" and "copolymeric material" refer to a polymeric material prepared from at least two monomers.

The term "polydiorganosiloxane" refers to a divalent segment of formula

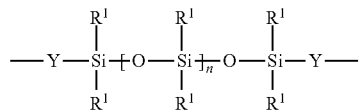

where each R$^1$ is independently an alkyl, haloalkyl, aralkyl, alkenyl, aryl, or aryl substituted with an alkyl, alkoxy, or halo; each Y is independently an alkylene, aralkylene, or a combination thereof, and subscript n is independently an integer of 0 to 1500.

The terms "room temperature" and "ambient temperature" are used interchangeably to mean temperatures in the range of 20° C. to 25° C.

Unless otherwise indicated, all numbers expressing feature sizes, amounts, and physical properties used in the specification and claims are to be understood as being modified in all instances by the term "about." Accordingly, unless indicated to the contrary, the numbers set forth in the foregoing specification and attached claims are approximations that can vary depending upon the desired properties sought to be obtained by those skilled in the art using the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range. Herein, the terms "at most" or "no greater than" a number (e.g., up to 50) includes the number (e.g., 50), and the term "at least" a number (e.g., no less than 5) includes the number (e.g., 5).

Terms related to orientation, such as "top," "bottom," "side," and "end," are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in some embodiments.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

As used herein, "have," "having," "include," "including," or "comprise," "comprising" are used in their open-ended sense, and generally mean "including, but not limited to." It will be understood that "consisting essentially of," and "consisting of," are subsumed in "comprising.".

The term "and/or" means one or all of the listed elements or a combination of at least two of the listed elements.

BRIEF DESCRIPTION OF THE DRAWINGS

This disclosure may be more completely understood in consideration of the following drawings and the accompanying detailed description of various aspects of the disclosure.

DETAILED DESCRIPTION

Figure 1:
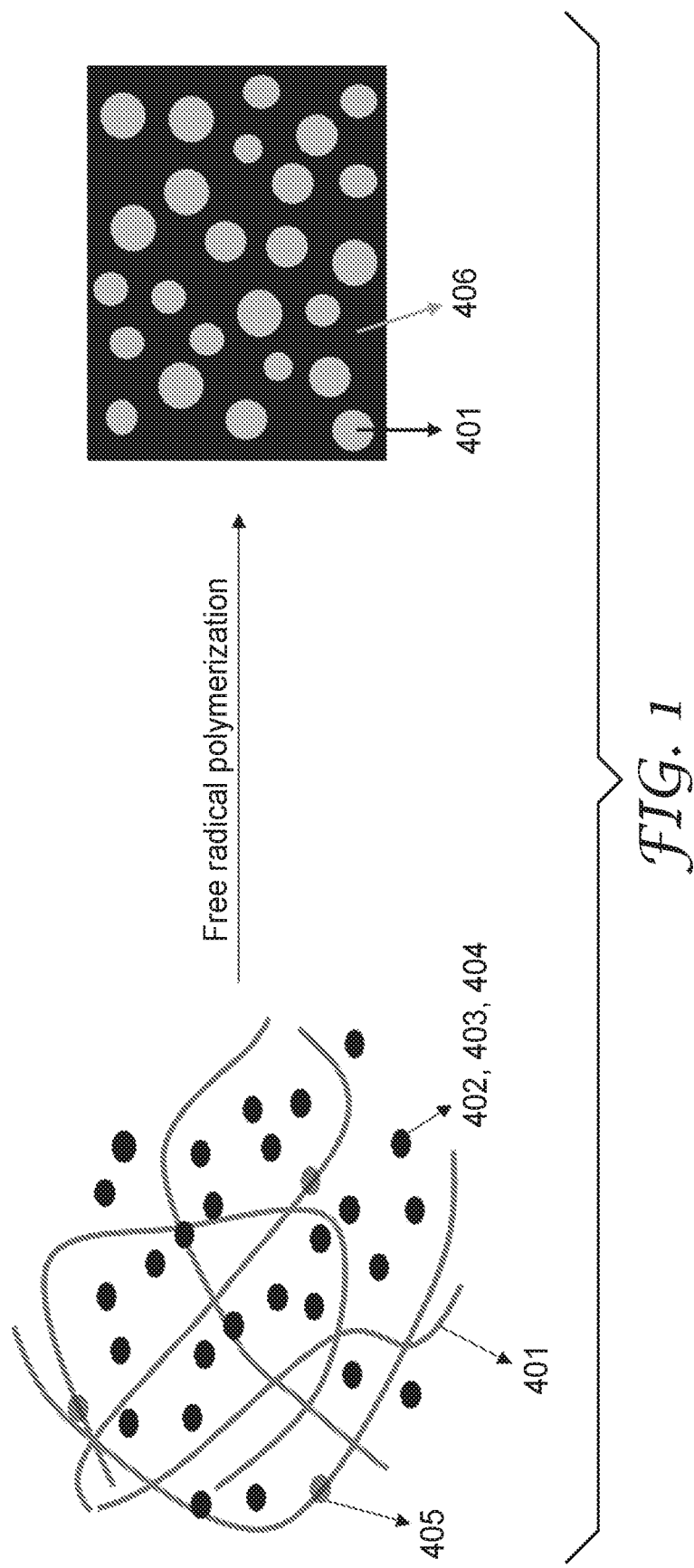
FIG. 1 schematically illustrates in situ phase separation.

Disclosed herein are articles that are phase separated. The articles include a matrix phase that includes acrylate functional groups; and a silicone elastomer phase dispersed in the matrix phase. Disclosed articles can be useful, for example as a pressure sensitive adhesive (PSA). Silicone containing PSAs can be useful because they provide good adhesion to low surface energy substrates and have self-wetting behavior. In the specific context of PSAs useful for optical applications, silicone containing PSAs can be useful because they have relatively low refractive indices. Acrylate containing PSAs can be beneficial as PSAs because they are generally low cost, can have their properties varied, and are compatible with various organic tackifiers and plasticizers. As such, disclosed articles can provide PSAs that have advantageous properties of both silicone- and acrylate-containing PSAs.

Acrylate

The matrix phase includes acrylate functional groups. Acrylate and methacrylate functional groups can be used and are referred to collectively herein as "(meth)acrylate" or "(meth)acrylic" monomers and polymers. (Meth)acrylate polymers may be copolymers, optionally in combination with other, non-(meth)acrylate, e.g., vinyl-unsaturated, monomers. Such polymers and their monomers are well-known in the polymer and adhesive arts, as are methods of preparing the monomers and polymers. Acrylate functional groups are found in both the polymers found in disclosed articles and monomers used in disclosed methods.

(Meth)acrylic containing PSAs generally have a glass transition temperature of about −20 degrees centigrade or less and may include from 100 to 60 weight percent of a C4-C12 alkyl ester component such as, for example, isooctyl acrylate, 2-ethyl-hexyl acrylate and n-butyl acrylate and from 0 to 40 weight percent of a polar component such as, for example, acrylic acid, methacrylic acid, ethylene, vinyl acetate, N-vinyl pyrrolidone and styrene macromer.

Suitable acidic monomers for preparing (meth)acrylic PSAs include those containing carboxylic acid functionality such as acrylic acid, methacrylic acid, itaconic acid, and the like; those containing sulfonic acid functionality such as 2-sulfoethyl methacrylate; and those containing phosphonic acid functionality. Preferred acidic monomers include acrylic acid and methacrylic acid.

Additional useful acidic monomers in the acidic copolymer include, but are not limited to, those selected from ethylenically unsaturated carboxylic acids, ethylenically unsaturated sulfonic acids, ethylenically unsaturated phosphonic acids, and mixtures thereof. Examples of such compounds include those selected from acrylic acid, methacrylic acid, itaconic acid, fumaric acid, crotonic acid, citraconic acid, maleic acid, oleic acid, B-carboxyethyl acrylate, 2-sulfoethyl methacrylate, styrene sulfonic acid, 2-acrylamido-2-methylpropane sulfonic acid, vinyl phosphonic acid, and the like, and mixtures thereof.

Due to their availability, acidic monomers of the present invention are typically the ethylenically unsaturated carboxylic acids. When even stronger acids are desired, acidic monomers include the ethylenically unsaturated sulfonic acids and ethylenically unsaturated phosphonic acids. Sulfonic and phosphonic acids generally provide a stronger interaction with a basic polymer. This stronger interaction can lead to greater improvements in cohesive strength, as well as higher temperature resistance and solvent resistance of the adhesive.

Suitable basic monomers for preparing (meth)acrylic PSAs include those containing amine functionality such as vinyl pyridine, N,N-diethylaminoethyl methacrylate, N,N-dimethylamino-ethyl methacrylate, N,N-diethylaminoethyl acrylate, N,N-dimethylaminoethyl acrylate, and N-t-butylaminoethyl methacrylate. Preferred basic monomers include N,N-dimethylaminoethyl methacrylate, and N,N-dimethylaminoethyl acrylate.

The (meth)acrylic PSAs may be self-tacky or tackified. Useful tackifiers for (meth)acrylics are rosin esters such as that available under the trade name FORAL 85 from Hercules, Inc., aromatic resins such as that available under the trade name PICCOTEX LC-55WK from Hercules, Inc., aliphatic resins such as that available under the trade name PICCOTAC 95 from Hercules, Inc., and terpene resins such as that available under the trade names PICCOLYTE A-115 and ZONAREZ B-100 from Arizona Chemical Co. Other materials can be added for special purposes, including hydrogenated butyl rubber, pigments, and curing agents to vulcanize the adhesive partially. Examples of acid-modified tackifiers include acid-modified polyhydric alcohol rosin ester tackifiers as described in U.S. Pat. No. 5,120,781.

In some embodiments, useful matrix phases can be derived from precursors or monomers that include from about 75 to about 95 parts by weight of an alkyl acrylate having 1 to 14 carbon in the alkyl group. The alkyl acrylate can include aliphatic, cycloaliphatic, or aromatic alkyl groups. Useful alkyl acrylates (e.g., acrylic acid alkyl ester monomers) include linear or branched monofunctional acrylates or methacrylates of non-tertiary alkyl alcohols, the alkyl groups of which have from 1 up to 14 and, in particular, from 1 up to 12 carbon atoms. Useful monomers can include, for example, 2-ethylhexyl(meth)acrylate, ethyl (meth)acrylate, methyl(meth)acrylate, n-propyl(meth)acrylate, isopropyl(meth)acrylate, pentyl(meth)acrylate, n-octyl (meth)acrylate, isooctyl(meth)acrylate, isononyl(meth) acrylate, n-butyl(meth)acrylate, isobutyl(meth)acrylate, hexyl(meth)acrylate, n-nonyl(meth)acrylate, isoamyl(meth) acrylate, n-decyl(meth)acrylate, isodecyl(meth)acrylate, dodecyl(meth)acrylate, isobornyl(meth)acrylate, cyclohexyl (meth)acrylate, phenylmeth(acrylate), benzylmeth(acrylate), and 2-methylbutyl(meth)acrylate, and combinations thereof.

Useful precursors for obtaining the matrix phase can also include from about 0 to about 5 parts of a copolymerizable polar monomer such as acrylic monomers containing carboxylic acid, amide, urethane, or urea functional groups. Weak polar monomers like N-vinyl lactams may also be included. A useful N-vinyl lactam is N-vinyl caprolactam. In general, the polar monomer content in the adhesive can include less than about 5 parts by weight or even less than about 3 parts by weight of one or more polar monomers. Polar monomers that are only weakly polar may be incorporated at higher levels, for example 10 parts by weight or less. Useful carboxylic acids include acrylic acid and methacrylic acid. Useful amides include N-vinyl caprolactam, N-vinyl pyrrolidone, (meth)acrylamide, N-methyl(meth) acrylamide, N,N-dimethyl acrylamide, N,N-dimethyl meth (acrylamide), and N-octyl(meth)acrylamide.

Useful matrices can be derived from precursors that also include from about 1 to about 25 parts of a hydrophilic polymeric compound based upon 100 parts of the alkyl acrylate and the copolymerizable polar monomer. The hydrophilic polymeric compound typically has an average molecular weight ($M_n$) of greater than about 500, or greater than about 1000, or even higher. Suitable hydrophilic polymeric compounds include poly(ethylene oxide) segments, hydroxyl functionality, or a combination thereof. The combination of poly(ethylene oxide) and hydroxyl functionality in the polymer needs to be high enough to make the resulting polymer hydrophilic. By "hydrophilic" it is meant that the polymeric compound can incorporate at least 25 weight percent of water without phase separation. Typically, suitable hydrophilic polymeric compounds may contain poly(ethylene oxide) segments that include at least 10, at least 20, or even at least 30 ethylene oxide units. Alternatively, suitable hydrophilic polymeric compounds include at least 25 weight percent of oxygen in the form of ethylene glycol groups from poly(ethylene oxide) or hydroxyl functionality based upon the hydrocarbon content of the polymer. Useful hydrophilic polymer compounds may be copolymerizable or non-copolymerizable with the adhesive composition, as long as they remain miscible with the adhesive and yield an optically clear adhesive composition. Copolymerizable, hydrophilic polymer compounds include, for example, CD552, available from Sartomer Company, Exton, Pa., which is a monofunctional methoxylated polyethylene glycol (550) methacrylate, or SR9036, also available from Sartomer, that is an ethoxylated bisphenol A dimethacrylate that has 30 polymerized ethylene oxide groups between the bisphenol A moiety and each methacrylate group. Other examples include phenoxypolyethylene glycol acrylate available from Jarchem Industries Inc., Newark, N.J. Other examples of polymeric hydrophilic compounds include poly acrylamide, poly-N,N-dimethylacrylamide, and poly-N-vinylpyrrolidone.

Useful matrices can be derived from precursors that also include from about 60 parts by weight to about 95 parts by weight of an alkyl acrylate having 1 to 14 carbon in the alkyl group and from about 0 parts by weight to about 5 parts by weight of a copolymerizable polar monomer. The alkyl acrylate and the copolymerizable polar monomer are described above. The precursors also include from about 5 parts by weight to about 50 parts by weight of a hydrophilic, hydroxyl functional monomeric compound based upon 100 parts of the alkyl acrylate and the copolymerizable polar monomer or monomers. The hydrophilic, hydroxyl functional monomeric compound typically has a hydroxyl equivalent weight of less than 400. The hydroxyl equivalent molecular weight is defined as the molecular weight of the monomeric compound divided by the number of hydroxyl groups in the monomeric compound. Useful monomers of this type include 2-hydroxyethyl acrylate and methacrylate, 3-hydroxypropyl acrylate and methacrylate, 4-hydroxybutyl acrylate and methacrylate, 2-hydroxyethylacrylamide, and N-hydroxypropylacrylamide. Additionally, hydroxy functional monomers based on glycols derived from ethylenoxide or propyleneoxide can also be used. An example of this type of monomer includes a hydroxyl terminated polypropylene glycol acrylate, available as BISOMER PPA 6 from Cognis, Germany. Diols and triols that have hydroxyl equivalent weights of less than 400 are also contemplated for the hydrophilic monomeric compound.

Additional details regarding useful monomers can be found, for example in U.S. Pat. No. 8,361,632, the disclosure of which is incorporated herein by reference thereto.

Useful matrices can also be formed from one or more (meth)acryloyl oligomers having a plurality of pendent, free-radically polymerizable functional groups, and having a $T_g \geq 20°$ C. (in some embodiments a $T_g \geq 50°$ C.); a free-radically polymerizable crosslinking agent and/or a diluent monomer, and a photoinitiator.

Disclosed matrices can contain 50 to 99 parts by weight, 60 to 95 parts or 70 to 95 parts of an oligomer having a plurality of pendent free-radically polymerizable functional groups and having a $T_g \geq 20°$ C., in some embodiments $\geq 50°$ C.; 1 to 50 parts by weight, 5 to 40 parts, or 5 to 30 parts of a free-radically polymerizable crosslinking agent and/or a diluent monomer; and 0.001 to 5 parts by weight, 0.001 to 1, or 0.01 to 0.1 parts of a photoinitiator, based on 100 parts by weight of oligomer and crosslinking agent and/or reactive diluent monomer.

In some embodiments, the crosslinking agent comprises 1 to 40 parts by weight, 1 to 30 parts by weight, or 1 to 20 parts by weight. In some embodiments, the reactive diluent comprises less than 25 parts by weight, less than 15 parts by weight, or less than 10 parts by weight.

The oligomer generally comprises polymerized monomer units comprising:
a) 50 to 99 parts by weight, 60 to 97 parts by weight, or 80 to 95 parts by weight of (meth)acryloyl monomer units homopolymerizable to a polymer having a glass transition temperature $\geq 20°$ C., or $\geq 50°$ C. (in some embodiments the (meth)acryloyl monomer units are (meth)acrylate monomer units),
b) 1 to 50 parts by weight, 3 to 40 parts by weight, or 5 to 20 parts by weight, of monomer units having a pendent, free-radically polymerizable functional groups, and
c) less than 40 parts by weight, preferably less than 30 parts by weight, most preferably less than 20 parts by weight, of monomer units homopolymerizable to a polymer having a glass transition temperature less than 20° C., based on 100 parts by weight of a) and b).

The first component oligomer comprises one or more high $T_g$ monomers, which if homopolymerized, yield a polymer having a $T_g > 20°$ C., or $> 50°$ C. Preferred high $T_g$ monomers are monofunctional (meth)acrylate esters of mono- and bicyclic aliphatic alcohols having at least 6 carbon atoms, and of aromatic alcohols. Both the cycloaliphatic and aromatic groups may be substituted, for example, by $C_{1-6}$ alkyl, halogen, sulfur, cyano, and the like. Especially preferred high $T_g$ monomers include 3,5-dimethyladamantyl (meth)acrylate; isobornyl (meth)acrylate; 4-biphenyl (meth)acrylate; phenyl (meth)acrylate; benzyl methacrylate; and 2-naphthyl (meth)acrylate; dicyclopentadienyl (meth)acrylate. Mixtures of high $T_g$ monomers may also be used. Providing the monomer can be polymerized with the rest of the monomers that comprise the (meth)acrylate monomers, any high $T_g$ monomer including styrene, vinylesters and the like, can be used. However, the high $T_g$ monomer is typically an acrylate or methacrylate ester.

Other high $T_g$ monomers include $C_1$-$C_{20}$ alkyl (meth)acrylates such as methyl methacrylate, ethyl methacrylate, isopropyl methacrylate, n-butyl methacrylate, isobutyl methacrylate, t-butyl (meth)acrylate, stearyl methacrylate, cyclohexyl methacrylate, 3,3,5-trimethylcyclohexyl methacrylate, tetrahydrofurfuryl methacrylate, allyl methacrylate, bromoethyl methacrylate; styrene; vinyl toluene; vinyl esters such as vinyl propionate, vinyl acetate, vinyl pivalate, and vinyl neononanoate; acrylamides such as N,N-dimethyl acrylamide, N,N-diethyl acrylamide, N-isopropyl acrylamide, N-octyl acrylamide, and N-t-butyl acrylamide, and (meth)acrylonitrile. Blends of high $T_g$ monomers may be used.

Most preferred high $T_g$ monomers are selected from linear, branched, cyclo, and bridged cycloaliphatic (meth)

acrylates, such as isobornyl (meth)acrylate, cyclohexyl methacrylate, 3,3,5-trimethylcyclohexyl methacrylate, methyl methacrylate, ethyl methacrylate, isopropyl methacrylate, n-butyl methacrylate, isobutyl methacrylate, t-butyl (meth)acrylate, stearyl methacrylate, and mixtures thereof, for their environmental (heat and light) stability.

The first component oligomer of the composition comprises one or more pendent groups that include free-radically polymerizable unsaturation. Preferred pendent unsaturated groups include (meth)acryloyl, including (meth)acryloxy, and (meth)acrylamido. Such pendent groups can be incorporated into the polymer in at least two ways. The most direct method is to include among the monomer units of ethylene di(meth)acrylate, 1,6-hexanediol diacrylate (HDDA), or bisphenol-A di(meth)acrylate. Useful polyunsaturated monomers include allyl, propargyl, and crotyl (meth)acrylates, trimethylolpropane triacrylate, pentaerythritol triacrylate, and allyl 2-acrylamido-2,2-dimethylacetate.

Representative examples of useful co-reactive compounds include hydroxyalkyl (meth)acrylates such as 2-hydroxyethyl (meth)acrylate, 4-hydroxybutyl (meth)acrylate, and 2-(2-hydroxyethoxy)ethyl (meth)acrylate; aminoalkyl (meth)acrylates such as 3-aminopropyl (meth)acrylate and 4-aminostyrene; oxazolinyl compounds such as 2-ethenyl-1,3-oxazolin-5-one and 2-propenyl-4,4-dimethyl-1,3-oxazolin-5-one; carboxy-substituted compounds such as (meth)acrylic acid and 4-carboxybenzyl (meth)acrylate; isocyanato-substituted compounds such as isocyanatoethyl (meth)acrylate and 4-isocyanatocyclohexyl (meth)acrylate; epoxy-substituted compounds such as glycidyl (meth)acrylate; aziridinyl-substituted compounds such as N-acryloylaziridine and 1-(2-propenyl)-aziridine; and acryloyl halides such as (meth)acryloyl chloride.

Preferred functional monomers have the general formula

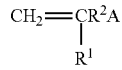

wherein $R^1$ is hydrogen, a $C_1$ to $C_4$ alkyl group, or a phenyl group, preferably hydrogen or a methyl group; $R^2$ is a single bond or a divalent linking group that joins an ethylenically unsaturated group to polymerizable or reactive functional group A and preferably contains up to 34, preferably up to 18, more preferably up to 10, carbon and, optionally, oxygen and nitrogen atoms and, when $R^2$ is not a single bond, is preferably selected from

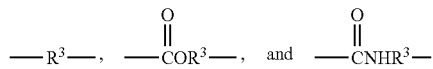

wherein $R^3$ is an alkylene group having 1 to 6 carbon atoms, a 5- or 6-membered cycloalkylene group having 5 to 10 carbon atoms, or an alkylene-oxyalkylene in which each alkylene includes 1 to 6 carbon atoms or is a divalent aromatic group having 6 to 16 carbon atoms; and A is a functional group, capable of free-radical addition to carbon-carbon double bonds, or a reactive functional group capable of reacting with a co-reactive functional group for the incorporation of a free-radically polymerizable functional group.

It will be understood, in the context of the above description of the first component oligomer, that the ethylenically-unsaturated monomer possessing a free-radically polymerizable group is chosen such that it is free-radically polymerizable with the crosslinking agent and reactive diluent. The reactions between functional groups provide a crosslink by forming a covalent bond by free-radical addition reactions of ethylenically-unsaturated groups between components. In the present invention the pendent functional groups react by an addition reaction in which no by product molecules are created, and the exemplified reaction partners react by this preferred mode.

Additional details regarding such acrylate-containing polymers can be found, for example in U.S. Patent Publication No. 20090156747, the disclosure of which is incorporated herein by reference thereto.

Silicone Elastomers

The silicone elastomer phase is dispersed in the matrix phase and consists of polydiorganosiloxane polyoxamide block copolymers. The silicone elastomer phase can include polydiorganosiloxane polyoxamide block copolymers that contain at least two repeat units of Formula I.

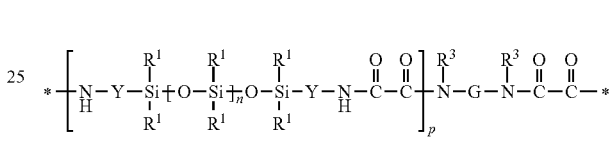

In this formula, each $R^1$ is independently an alkyl, haloalkyl, aralkyl, alkenyl, aryl, or aryl substituted with an alkyl, alkoxy, or halo. Each Y is independently an alkylene, aralkylene, or a combination thereof. Subscript n is independently an integer of 0 to 1500 and the subscript p is an integer of 1 to 10. Group G is a divalent group that is the residue unit that is equal to a diamine of formula $R^3$HN-G-NHR$^3$ minus the two —NHR$^3$ groups. Group $R^3$ is hydrogen or alkyl (e.g., an alkyl having 1 to 10, 1 to 6, or 1 to 4 carbon atoms) or $R^3$ taken together with G and with the nitrogen to which they are both attached forms a heterocyclic group (e.g., $R^3$HN-G-NHR$^3$ is piperazine or the like). Each asterisk (*) indicates a site of attachment of the repeat unit to another group in the copolymer such as, for example, another repeat unit of Formula I.

Suitable alkyl groups for $R^1$ in Formula I typically have 1 to 10, 1 to 6, or 1 to 4 carbon atoms. Exemplary alkyl groups include, but are not limited to, methyl, ethyl, isopropyl, n-propyl, n-butyl, and iso-butyl. Suitable haloalkyl groups for $R^1$ often have only a portion of the hydrogen atoms of the corresponding alkyl group replaced with a halogen. Exemplary haloalkyl groups include chloroalkyl and fluoroalkyl groups with 1 to 3 halo atoms and 3 to 10 carbon atoms. Suitable alkenyl groups for $R^1$ often have 2 to 10 carbon atoms. Exemplary alkenyl groups often have 2 to 8, 2 to 6, or 2 to 4 carbon atoms such as ethenyl, n-propenyl, and n-butenyl. Suitable aryl groups for $R^1$ often have 6 to 12 carbon atoms. Phenyl is an exemplary aryl group. The aryl group can be unsubstituted or substituted with an alkyl (e.g., an alkyl having 1 to 10 carbon atoms, 1 to 6 carbon atoms, or 1 to 4 carbon atoms), an alkoxy (e.g., an alkoxy having 1 to 10 carbon atoms, 1 to 6 carbon atoms, or 1 to 4 carbon atoms), or halo (e.g., chloro, bromo, or fluoro). Suitable aralkyl groups for $R^1$ usually have an alkylene group with 1 to 10 carbon atoms and an aryl group with 6 to 12 carbon atoms. In some exemplary aralkyl groups, the aryl group is phenyl and the alkylene group has 1 to 10 carbon atoms, 1 to 6 carbon atoms, or 1 to 4 carbon atoms (i.e., the structure of the aralkyl is alkylene-phenyl where an alkylene is bonded to a phenyl group).

In some repeat units of Formula I, at least 50 percent of the $R^1$ groups are methyl. For example, at least 60 percent, at least 70 percent, at least 80 percent, at least 90 percent, at least 95 percent, at least 98 percent, or at least 99 percent of the $R^1$ groups can be methyl. The remaining $R^1$ groups can be selected from an alkyl having at least two carbon atoms, haloalkyl, aralkyl, alkenyl, aryl, or aryl substituted with an alkyl, alkoxy, or halo.

Each Y in Formula I is independently an alkylene, aralkylene, or a combination thereof. Suitable alkylene groups typically have up to 10 carbon atoms, up to 8 carbon atoms, up to 6 carbon atoms, or up to 4 carbon atoms. Exemplary alkylene groups include methylene, ethylene, propylene, butylene, and the like. Suitable aralkylene groups usually have an arylene group with 6 to 12 carbon atoms bonded to an alkylene group with 1 to 10 carbon atoms. In some exemplary aralkylene groups, the arylene portion is phenylene. That is, the divalent aralkylene group is phenylene-alkylene where the phenylene is bonded to an alkylene having 1 to 10, 1 to 8, 1 to 6, or 1 to 4 carbon atoms. As used herein with reference to group Y, "a combination thereof" refers to a combination of two or more groups selected from an alkylene and aralkylene group. A combination can be, for example, a single aralkylene bonded to a single alkylene (e.g., alkylene-arylene-alkylene). In one exemplary alkylene-arylene-alkylene combination, the arylene is phenylene and each alkylene has 1 to 10, 1 to 6, or 1 to 4 carbon atoms.

Each subscript n in Formula I is independently an integer of 0 to 1500. For example, subscript n can be an integer up to 1000, up to 500, up to 400, up to 300, up to 200, up to 100, up to 80, up to 60, up to 40, up to 20, or up to 10. The value of n is often at least 1, at least 2, at least 3, at least 5, at least 10, at least 20, or at least 40. For example, subscript n can be in the range of 40 to 1500, 0 to 1000, 40 to 1000, 0 to 500, 1 to 500, 40 to 500, 1 to 400, 1 to 300, 1 to 200, 1 to 100, 1 to 80, 1 to 40, or 1 to 20.

The subscript p is an integer of 1 to 10. For example, the value of p is often an integer up to 9, up to 8, up to 7, up to 6, up to 5, up to 4, up to 3, or up to 2. The value of p can be in the range of 1 to 8, 1 to 6, or 1 to 4.

Group G in Formula I is a residual unit that is equal to a diamine compound of formula $R^3HN$-G-$NHR^3$ minus the two amino groups (i.e., —$NHR^3$ groups). The diamine can have primary or secondary amino groups. Group $R^3$ is hydrogen or alkyl (e.g., an alkyl having 1 to 10, 1 to 6, or 1 to 4 carbon atoms) or $R^3$ taken together with G and with the nitrogen to which they are both attached forms a heterocyclic group (e.g., $R^3HN$-G-$NHR^3$ is piperazine). In most embodiments, $R^3$ is hydrogen or an alkyl. In many embodiments, both of the amino groups of the diamine are primary amino groups (i.e., both $R^3$ groups are hydrogen) and the diamine is of formula $H_2N$-G-$NH_2$.

In some embodiments, G is an alkylene, heteroalkylene, polydiorganosiloxane, arylene, aralkylene, or a combination thereof. Suitable alkylenes often have 2 to 10, 2 to 6, or 2 to 4 carbon atoms. Exemplary alkylene groups include ethylene, propylene, butylene, and the like. Suitable heteroalkylenes are often polyoxyalkylenes such as polyoxyethylene having at least 2 ethylene units, polyoxypropylene having at least 2 propylene units, or copolymers thereof. Suitable polydiorganosiloxanes include the polydiorganosiloxane diamines of Formula III, which are described below, minus the two amino groups. Exemplary polydiorganosiloxanes include, but are not limited to, polydimethylsiloxanes with alkylene Y groups. Suitable aralkylene groups usually contain an arylene group having 6 to 12 carbon atoms bonded to an alkylene group having 1 to 10 carbon atoms. Some exemplary aralkylene groups are phenylene-alkylene where the phenylene is bonded to an alkylene having 1 to 10 carbon atoms, 1 to 8 carbon atoms, 1 to 6 carbon atoms, or 1 to 4 carbon atoms. As used herein with reference to group G, "a combination thereof" refers to a combination of two or more groups selected from an alkylene, heteroalkylene, polydiorganosiloxane, arylene, and aralkylene. A combination can be, for example, an aralkylene bonded to an alkylene (e.g., alkylene-arylene-alkylene). In one exemplary alkylene-arylene-alkylene combination, the arylene is phenylene and each alkylene has 1 to 10, 1 to 6, or 1 to 4 carbon atoms.

The polydiorganosiloxane polyoxamide tends to be free of groups having a formula —$R^a$—(CO)—NH— where $R^a$ is an alkylene. All of the carbonylamino groups along the backbone of the copolymeric material are part of an oxalylamino group (i.e., the —(CO)—(CO)—NH— group). That is, any carbonyl group along the backbone of the copolymeric material is bonded to another carbonyl group and is part of an oxalyl group. More specifically, the polydiorganosiloxane polyoxamide has a plurality of aminoxalylamino groups.

The polydiorganosiloxane polyoxamide is a linear, block copolymer and can be an elastomeric material. Unlike many of the known polydiorganosiloxane polyamides that are generally formulated as brittle solids or hard plastics, the polydiorganosiloxane polyoxamides can be formulated to include greater than 50 weight percent polydiorganosiloxane segments based on the weight of the copolymer. The weight percent of the diorganosiloxane in the polydiorganosiloxane polyoxamides can be increased by using higher molecular weight polydiorganosiloxanes segments to provide greater than 60 weight percent, greater than 70 weight percent, greater than 80 weight percent, greater than 90 weight percent, greater than 95 weight percent, or greater than 98 weight percent of the polydiorganosiloxane segments in the polydiorganosiloxane polyoxamides. Higher amounts of the polydiorganosiloxane can be used to prepare elastomeric materials with lower modulus while maintaining reasonable strength.

Some of the polydiorganosiloxane polyoxamides can be heated to a temperature up to 200° C., up to 225° C., up to 250° C., up to 275° C., or up to 300° C. without noticeable degradation of the material. For example, when heated in a thermogravimetric analyzer in the presence of air, the copolymers often have less than a 10 percent weight loss when scanned at a rate 50° C. per minute in the range of 20° C. to about 350° C. Additionally, the copolymers can often be heated at a temperature such as 250° C. for 1 hour in air without apparent degradation as determined by no detectable loss of mechanical strength upon cooling.

The copolymeric material of Formula I can be optically clear. As used herein, the term "optically clear" refers to a material that is clear to the human eye. An optically clear copolymeric material often has a luminous transmission of at least about 90 percent, a haze of less than about 2 percent, and opacity of less than about 1 percent in the 400 to 700 nm wavelength range. Both the luminous transmission and the haze can be determined using, for example, the method of ASTM-D 1003-95.

Additionally, the copolymeric material of Formula I can have a low refractive index. As used herein, the term "refractive index" refers to the absolute refractive index of a material (e.g., copolymeric material) and is the ratio of the speed of electromagnetic radiation in free space to the speed of the electromagnetic radiation in the material of interest. The electromagnetic radiation is white light. The index of refraction is measured using an Abbe refractometer, available commercially, for example, from Fisher Instruments of Pittsburgh, Pa. The measurement of the refractive index can depend, to some extent, on the particular refractometer used. The copolymeric material usually has a refractive index in the range of about 1.41 to about 1.50.

Additional information regarding the silicone elastomeric containing polymers can be found for example in U.S. Pat. Nos. 7,078,093; 6,569,521; 6,730,397; 7,501,184; 7,371,464; 7,705,101; and 8,063,166, U.S. Patent Publication No. 2011/071,270; and PCT Publication No. WO 2011/082,069, the disclosures of which are incorporated herein by reference thereto.

Useful polydiorganosiloxane diamines include any polydiorganosiloxane diamines that fall within Formula II above and include those polydiorganosiloxane diamines having molecular weights in the range of about 700 to 150,000, preferably from about 10,000 to about 60,000, more preferably from about 25,000 to about 50,000. Suitable polydiorganosiloxane diamines and methods of manufacturing polydiorganosiloxane diamines are disclosed in, e.g., U.S. Pat. Nos. 3,890,269, 4,661,577, 5,026,890, and 5,276,122, International Patent Publication Nos. WO 95/03354 and WO 96/35458, each of which is incorporated herein by reference.

Examples of useful polydiorganosiloxane diamines include polydimethylsiloxane diamine, polydiphenylsiloxane diamine, polytrifluoropropylmethylsiloxane diamine, polyphenylmethylsiloxane diamine, polydiethylsiloxane diamine, polydivinylsiloxane diamine, polyvinylmethylsiloxane diamine, poly(5-hexenyl)methylsiloxane diamine, and mixtures and copolymers thereof.

Suitable polydiorganosiloxane diamines are commercially available from, for example, Shin Etsu Silicones of America, Inc., Torrance, Calif., and Huls America, Inc. Preferably the polydiorganosiloxane diamines are substantially pure and prepared as disclosed in U.S. Pat. No. 5,214,119 and incorporated herein. Polydiorganosiloxane diamines having such high purity are prepared from the reaction of cyclic organosilanes and bis(aminoalkyl)disiloxanes utilizing an anhydrous amino alkyl functional silanolate catalyst such as tetramethylammonium-3-aminopropyldimethyl silanolate, preferably in an amount less than 0.15% by weight based on the weight of the total amount of cyclic organosiloxane with the reaction run in two stages. Particularly preferred polydiorganosiloxane diamines are prepared using cesium and rubidium catalysts and are disclosed in U.S. Pat. No. 5,512,650 and incorporated herein.

The polydiorganosiloxane diamine component provides a means of adjusting the modulus of the resultant silicone polyurea block copolymer. In general, high molecular weight polydiorganosiloxane diamines provide copolymers of lower modulus whereas low molecular polydiorganosiloxane polyamines provide copolymers of higher modulus.

The silicone containing polymer, the acrylate functional group containing monomer, or both can be described by the inherent viscosity (IV) thereof. The inherent viscosity (IV) provides a simple method of estimating the molecular weight of an adhesive (or a polymer). An IV is measured by determining the flow time in a viscometer of a standard volume of solvent and the flow time of a dilute solution of the adhesive (or a polymer) in the same solvent.

In some embodiments, the polydiorganosiloxane polyoxamide polymer(s) has an IV of at least 0.5, or at least 0.8. In some embodiments, the polydiorganosiloxane polyoxamide polymer, has an IV of not greater than 1.2, or not greater than 2.8. In some embodiments, the polydiorganosiloxane polyoxamide polymer(s) has an IV from 0.8 to 1.2, for example. A silicone containing polymer having such an IV provides an article that is phase separated into the matrix phase and the silicone domains. In some embodiments, the ratio of the IV of the silicone containing polymer to the acrylate functional group containing monomer is from 0.9 to 1.5. A silicone containing polymer having such an IV provides an article that is phase separated into the matrix phase and the silicone phase, has silicone domains having desired sizes, have the desired adhesive properties (e.g., peel, shear, etc.) and desired optical properties. The matrix phase can also include compatibilizers or a residue of a compatibilizer. Examples of useful compatibilizers can include, for example isocyanatoethyl methacrylate (IEM), and PDMS diamines (e.g., having a molecular weight from 500 g/mol to 100,000 g/mol for example). In some embodiments, useful PDMS diamines can have molecular weights from 10,000 g/mol to 50,000 g/mol, or from 20,000 g/mol to 35,000 g/mol, for example. The particular compatabilizers, the amounts thereof, or combinations thereof can be chosen such that the domain size can be controlled or chosen, for example.

Properties of Articles

As discussed above, disclosed articles include a matrix phase comprising an acrylate functional group and a silicone elastomer phase dispersed in the matrix phase. In some embodiments, the silicone elastomer phase can be stably dispersed in the matrix phase.

Disclosed articles can be described by the size of the silicone domains. In some embodiments, the silicone domain size can be measured using scanning electron microscopy (SEM). In some embodiments, an average diameter or a range of diameters, or both, as measured from scanning electron microscope (SEM) imaging can be utilized to describe the silicone domains. In some embodiments, an average diameter or a range of diameters, or both of the silicone domain size are not less than 1 micrometer (μm), or not less than 2 μm. In some embodiments, an average diameter or a range of diameters, or both of the silicone domain size are not greater than 8 μm, or not greater than 5 μm.

Methods of Forming Adhesive Layer

Also disclosed herein are methods of forming an adhesive layer. Such methods include at least the steps of combining a silicone elastomer, an acrylate functional group containing monomer, an initiator, solvent and a compatibilizer to form a coating composition; forming a film comprising the coating composition; and drying the film to form an adhesive layer. Additional steps may also optionally be included. The method can be described as preparing a hybrid silicone and polyacrylate PSA by an in situ phase separation method, in which acrylate monomers are polymerized via free radical polymerization in a solvent in the presence of a solvated silicone polymer. This is schematically illustrated in FIG. 1.

FIG. 1 illustrates an embodiment that includes a silicone elastomer 401, an acrylic monomer 402, an initiator 403, solvent 404, and compatibilizer 405. After polymerization, silicone elastomer 401 are stably dispersed in the matrix phase 406 that includes the acrylate polymer.

The silicone elastomer can include polydiorganosiloxane polyoxamides such as those discussed above. Characteristics, properties and examples thereof include those discussed above. Silicone elastomers useful for disclosed methods can be at least partially functionalized with reactive functional groups. Useful reactive functional groups can include, but are not limited to, hydroxyl, amino (especially secondary amino), oxazolonyl, oxazolinyl, acetoacetyl, carboxyl, isocyanato, epoxy, aziridinyl, acyl halide, and cyclic anhydride groups. Preferred among these are carboxyl, hydroxyl and aziridinyl groups.

Acrylate functional group containing monomers include those discussed above.

Useful initiators can include, for example thermal or photoinitiators. Examples of thermal initiators include peroxides such as benzoyl peroxide and its derivatives or azo compounds such as VAZO 67, available from E. I. du Pont de Nemours and Co. Wilmington, Del., which is 2,2'-azobis-(2-methylbutyronitrile), or V-601, available from Wako Specialty Chemicals, Richmond, Va., which is dimethyl-2,2'-azobisisobutyrate. A variety of peroxide or azo compounds are available that can be used to initiate thermal polymerization at a wide variety of temperatures. The precursor mixtures can include a photoinitiator. Particularly useful are initiators such as IRGACURE 651, available from Ciba Chemicals, Tarrytown, N.Y., which is 2,2-dimethoxy-2-phenylacetophenone. Typically, the crosslinker, if present, is added to the precursor mixtures in an amount of from about 0.05 parts by weight to about 5.00 parts by weight based upon the other constituents in the mixture. The initiators are typically added to the precursor mixtures in the amount of from 0.05 parts by weight to about 2 parts by weight. The precursor mixtures can be polymerized using actinic radiation or heat.

Useful solvents can include any solvent or mixture of solvents that can form a homogenous solution of the components necessary to form the coating composition. Examples of useful solvents can include, for example ethyl acetate (EtOAC), methanol (MeOH).

The precursor composition also includes one or more compatibilizers. The compatibilizer can function to compatibilize the silicone elastomer and the acrylate functional group containing monomer in the precursor composition. Examples of useful compatibilizers can include, for example isocyanatoethyl methacrylate (IEM), and PDMS diamines (e.g., having a molecular weight from 500 g/mol to 100,000 g/mol for example). The particular compatabilizers, the amounts thereof, or combinations thereof can be chosen such that the domain size can be controlled or chosen, for example.

The step of forming the film can be accomplished using various known methods including, for example roll coating, spray coating, knife coating, die coating, and the like. Alternatively, the coating composition may also be delivered as a liquid to fill a gap between two substrates.

The step of drying the film can be accomplished using various known methods including, for example drying in an oven, drying at room temperature, and the like.

Applications

In some embodiments, disclosed articles can be utilized as PSAs. One well known means of identifying or determining if something is a PSA is the Dahlquist criterion. This criterion defines a PSA as an adhesive having a 1 second creep compliance of greater than $1 \times 10^{-6}$ cm2/dyne as described in *Handbook of PSA Technology*, Donatas Satas (Ed.), $2^{nd}$ Edition, p. 172, Van Nostrand Reinhold, New York, N.Y., 1989. Alternatively, since modulus is, to a first approximation, the inverse of creep compliance, PSAs may be defined as adhesives having a Young's modulus of less than $1 \times 10^6$ dynes/cm2. Another means of identifying a PSA is that it is aggressively and permanently tacky at room temperature and firmly adheres to a variety of dissimilar surfaces upon mere contact without the need of more than finger or hand pressure, and which may be removed from smooth surfaces without leaving a residue as described in *Glossary of Terms Used in the Pressure Sensitive Tape Industry* provided by the Pressure Sensitive Tape Council, 1996. Another suitable definition of a suitable PSA is that it preferably has a room temperature storage modulus within the area defined by the following points as plotted on a graph of modulus versus frequency at 25 degrees centigrade: a range of moduli from approximately $2 \times 10^5$ to $4 \times 10^5$ dynes/cm2 at a frequency of approximately 0.1 radians/sec (0.017 Hz), and a range of moduli from approximately $2 \times 10^6$ to $8 \times 10^6$ dynes/cm2 at a frequency of approximately 100 radians/sec (17 Hz) (for example see FIG. 8-16 on p. 173 of *Handbook of PSA Technology* (Donatas Satas, Ed.), $2^{nd}$ Edition, Van Nostrand Rheinhold, N.Y., 1989). Any of these methods of identifying a PSA may be used to identify an article that can be utilized as a PSA.

In some embodiments, disclosed articles that are useful as PSAs can have thicknesses of not less than 10 μm, not less than 15 μm. In some embodiments, disclosed articles that are useful as PSAs can have thicknesses of not greater than 100 μm, not greater than 50 μm, or not greater than 30 μm.

Disclosed articles can also be utilized as optical articles. Such optical articles can be utilized alone or in combination with other films, layers, optical elements, devices or portions thereof, or combinations thereof.

In certain embodiments, display devices of the present disclosure include: an organic light emitting diode panel having a multi-layer construction including one or more adhesive films; and a polymeric film as described herein incorporated within the multi-layer construction of the organic light emitting diode panel. In this context, in certain embodiments, "incorporated within the multi-layer construction" means that the polymeric film of the present disclosure replaces one or more adhesive films (e.g., optically clear adhesive films) of the multi-layer construction, particularly if the polymeric film includes an adhesive matrix. In this context, in certain embodiments, "incorporated within the multi-layer construction" means that the polymeric film of the present disclosure is incorporated into one or more adhesive films (e.g., optically clear adhesive films) of the multi-layer construction, particularly if the polymeric film itself does not include an adhesive matrix.

In certain embodiments, display devices include: an organic light emitting diode panel having a multi-layer construction including one or more adhesive films; and a polymeric film incorporated within the multi-layer construction of the organic light emitting diode panel. In such embodiments, the polymeric film includes a first polymeric layer having two major surfaces, wherein the first polymeric layer includes: a first polymeric matrix having a refractive index $n_1$; and particles having a refractive index $n_2$ uniformly dispersed within the first polymeric matrix. The particles are present in an amount of less than 30 vol-%, based on the volume of the first polymeric layer, and have a particle size range of 400 nm to 3000 nm.

In such embodiments, $n_1$ is different than $n_2$. In some embodiments, $n_1$ is at least 0.01 unit different than $n_2$. In some embodiments, $n_1$ is at least 0.02 unit, or at least 0.03 unit, or at least 0.04 unit, or at least 0.05 unit different than $n_2$. In some embodiments, $n_1$ is at most 0.5 unit different than $n_2$. In some embodiments, $n_1$ is within 0.5 unit of $n_2$, $n_1$ is within 0.4 unit of $n_2$, $n_1$ is within 0.3 unit of $n_2$, $n_1$ is within 0.2 unit of $n_2$, or $n_1$ is within 0.1 unit of $n_2$. In this context "within" means within 0.5 unit (or 0.4 unit, or 0.3 unit, or 0.2 unit, or 0.1 unit) higher or lower.

Significantly, in certain embodiments, a display device that includes a polymeric film of the present disclosure has an off-axis color shift (0-45°) that is at least 5% better (or at least 10% better, or at least 20% better, or at least 30% better) than an off-axis color shift compared to a display device that includes a non-diffusive optically clear adhesive in place of the polymeric film. In certain embodiments, a display device that includes a polymeric film of the present disclosure has an off-axis color shift (0-60°) that is at least 5% better (or at least 10% better, or at least 20% better, or at least 30% better) than an off-axis color shift compared to a display device that includes a non-diffusive optically clear adhesive in place of the polymeric film. In this context, a "non-diffusive" optically clear adhesive refers to an adhesive that is free of any light scattering particles or domains. Such an adhesive typically has a bulk haze of less than 0.5%.

Display devices of the present disclosure may be flexible or rigid. Examples of OLED displays that could incorporate the polymeric films of the present disclosure are described in U.S. Pat. App. Nos. US 2016/0001521 (Tanaka et al.), US 2014/0299844 (You et al.), and US 2016/0155967 (Lee et al.).

Figure 2:
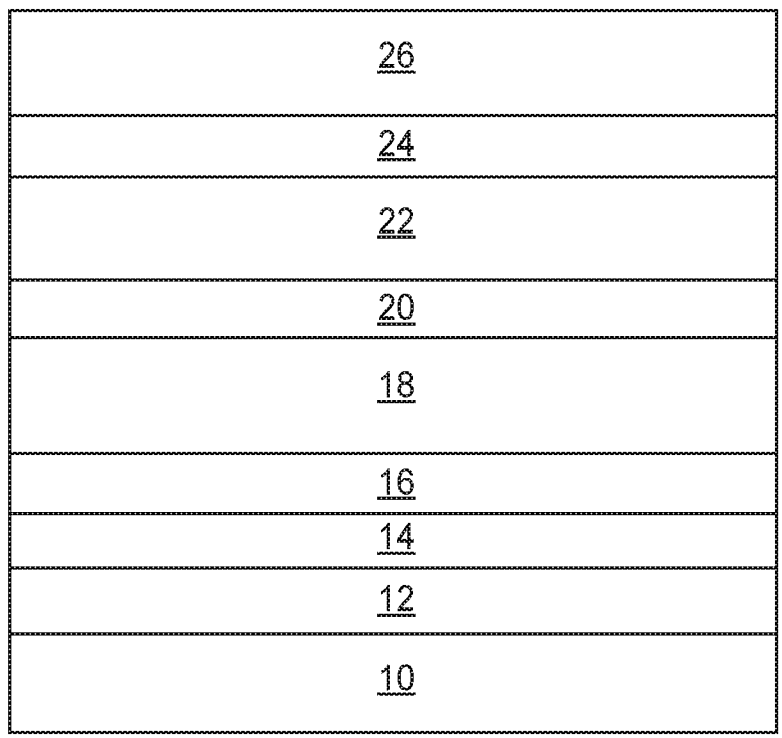
FIG. 2 is a cross-sectional representation of an organic light emitting diode panel having a multi-layered construction (layers are not to scale).

Exemplary devices include an organic light emitting diode panel having a multi-layered construction that includes, as shown in FIG. 2, an active-matrix organic light-emitting diode (AMOLED) panel 10; a first adhesive film 12 disposed on the active-matrix organic light-emitting diode panel 10; a barrier film 14 disposed on the first adhesive film 12; a second adhesive film 16 disposed on the barrier film 14; a circular polarizer 18 disposed on the second adhesive film 16; a third adhesive film 20 disposed on the circular polarizer 18; a touch panel 22 disposed on the third adhesive film 20; a fourth adhesive film 24 disposed on the touch panel 22; and a cover window 26 disposed on the fourth adhesive film 24. In certain embodiments, first adhesive film 12 includes an adhesive with good barrier properties like polyisobutylene. In certain embodiments, barrier film 14 is a conventional inorganic/organic multi-layer barrier film.

The display device of FIG. 2 is exemplary only of various multi-layered constructions. In certain embodiments, for example, barrier film 14 is incorporated into the AMOLED panel 10. In certain embodiments, first adhesive film 12 and barrier film 14 combined form a barrier against moisture and oxygen. In certain embodiments, touch panel 22 is incorporated into the AMOLED panel 10.

In certain multi-layer constructions, a polymeric film of the present disclosure includes at least one adhesive matrix. In such embodiments, such polymeric film can be the first adhesive film 12 (FIG. 2). In certain multi-layer constructions, a polymeric film of the present disclosure does not include an adhesive matrix. In such embodiments, such polymeric film can be incorporated within the first adhesive film 12 (FIG. 2).

In certain embodiments, the second, third, and/or fourth adhesive films (16, 20, 24 of FIG. 2) include (or is replaced by) a polymeric film of the present disclosure. In certain embodiments, the third and/or fourth adhesive films (20, 24 of FIG. 2) include (or is replaced by) a polymeric film of the present disclosure.

The adhesive films of the multi-layer construction shown in FIG. 2 that do not include a polymeric film include an optically clear adhesive as described above. In certain embodiments, first adhesive film 12 would typically have some barrier properties against moisture and oxygen.

Figure 3:
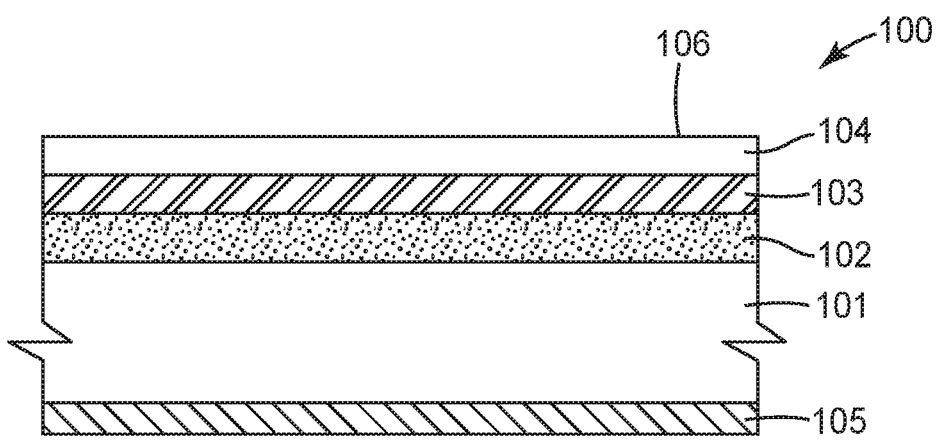
FIG. 3 is a cross-sectional representation of an exemplary active-matrix organic light-emitting diode panel (AMOLED panel).

In certain embodiments, the active-matrix organic light-emitting diode panel (10 of FIG. 2) includes an organic electroluminescent layer. For example, an exemplary active-matrix organic light-emitting diode panel (AMOLED panel) is shown in FIG. 3, and includes a driving substrate 101 in which a driving device array (e.g., a thin-film transistor (TFT) array) is arranged, an organic electroluminescent layer 102, a cathode electrode layer 103, and an encapsulation layer 104. A color filter layer (not shown) may be further arranged between the organic electroluminescent layer 102 and the encapsulation layer 104. A reflective layer 105 for reflecting light toward the encapsulation layer 104, that is, toward a light-emitting surface 106, may be provided under the driving substrate 101. Because the AMOLED panel is a self-emissive display panel in which the organic electroluminescent layer 102 generates light by using a driving signal, a separate light source (e.g., a backlight) may not be necessary.

In certain embodiments, a barrier film (14 of FIG. 2) includes an optical substrate such as COP (cyclic olefin polymer) or PET (polyethylene terephthalate) deposited with alternating layers of organic/inorganic materials that form an oxygen and moisture barrier. Examples of inorganic materials include silica, alumina, silicon carbide, and silicon nitride. An example includes a cured tricyclodecane dimethanol diacrylate and silica alternating layers). The organic layers are typically highly crosslinked acrylic materials.

Figure 4:
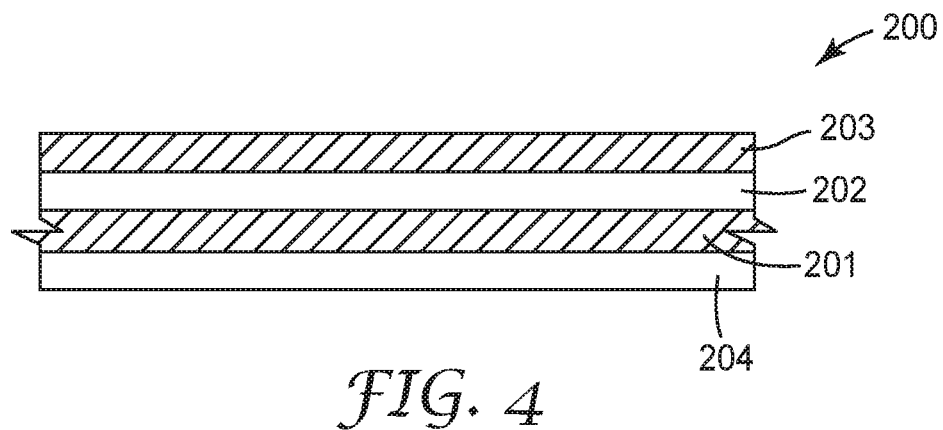
FIG. 4 is a cross-sectional representation of a circular polarizer according to an exemplary embodiment of the present disclosure.

An exemplary circular polarizer (18 of FIG. 2) is shown in FIG. 4, which is a cross-sectional view of the circular polarizer 200 according to an exemplary embodiment. Referring to FIG. 2, the circular polarizer 200 may include a linear polarizer 202, an upper support plate 203 and a lower support plate 201 that support the linear polarizer 202, and a quarter (λ/4) phase plate 204. The linear polarizer 202 may be, for example, a polyvinyl alcohol (PVA) film. The upper support plate 203 and the lower support plate 201 may be, for example, tri-acetyl-cellulose (TAC) films. The λ/4 phase plate 204 may be adhered to the lower support plate 201 by using an OCA layer. Exemplary embodiments are not limited to these types. The linear polarizer 202 linearly polarizes the external light L1. The λ/4 phase plate 204 circularly polarizes linearly polarized light and linearly polarizes circularly polarized light.

Figure 5:
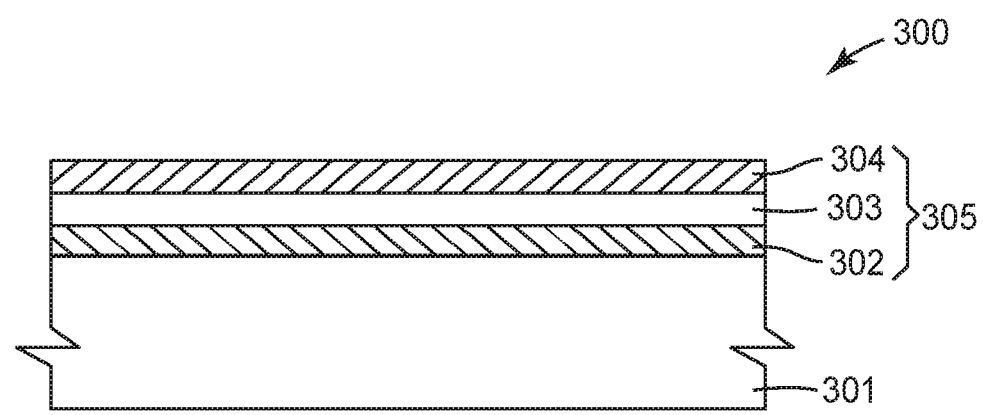
FIG. 5 is a cross-sectional representation of a capacitive touch panel according to an exemplary embodiment of the present disclosure.

In certain embodiments, a touch panel (22 of FIG. 2) includes a base substrate configured to transmit light and a touch electrode layer configured to receive a touch input. For example, FIG. 5 is a cross-sectional view of the touch panel 300 that is a capacitive touch panel according to an exemplary embodiment. The touch panel 300 is a manipulation unit that receives a user input. Resistive touch panels or capacitive touch panels are used in mobile devices. Referring to FIG. 5, the touch panel 300 may include a base substrate 301 that is a light-transmitting base substrate and a touch electrode layer 305 that is a light-transmitting touch electrode layer. The touch electrode layer 305 may include first and second electrode layers 302 and 304, and a dielectric layer 303 that is disposed between the first and second electrode layers 302 and 304.

The first electrode layer 302 may be formed by forming as a patterned thin film a conductive metal such as indium tin oxide (ITO), copper metal mesh, or silver nanowires on the base substrate 301 by using vacuum deposition, sputtering, or plating, etc. The dielectric layer 303 may be formed on the first electrode layer 302, and the second electrode layer 304 may be formed by forming as a patterned thin film a conductive metal on the dielectric layer 303 by using vacuum deposition, sputtering, or plating, etc. For example, the first electrode layer 302 may include a plurality of horizontal electrodes, and the second electrode layer 304 may include a plurality of vertical electrodes. Touch cells are formed at intersections between the horizontal electrodes and the vertical electrodes. The horizontal electrodes may be, for example, driving electrodes, and the vertical electrodes may be, for example, receiving electrodes. When a touching object, for example, a user's hand or a touch pen (e.g., stylus) approaches or contacts the touch panel 300, a change in a capacitance of a touch cell occurs. When a touch event occurs, a position of the touch cell may be detected by detecting the change in the capacitance. Also, the touch panel 300 may be formed so that the first and second electrode layers 302 and 304 are formed on a top surface and a bottom surface of the base substrate 301, respectively. Also, the touch panel 300 may be formed so that two substrates on which electrode layers are formed are bonded to each other. The touch panel 300 may be manufactured as a pliable light-transmitting film.

In certain embodiments, a cover window (26 of FIG. 2) includes a curved portion and/or a flat portion. The cover window may be made of a material selected from glass or an optically clear plastic. The cover window may allow an image that is displayed on the OILED panel to be seen therethrough and may protect the OLEO panel from external shock. Thus, the cover window is made of one or more transparent materials. The cover window may be formed of a rigid material, e.g., glass or plastics such as a polycarbonate or a polymethylmethacrylate. The cover window may be formed of a flexible material, e.g., plastics such as a polycarbonate or a polymethylmethacrylate.

In some embodiments, the pressure sensitive adhesives of the present disclosure are suitable for adhering a medical substrate to a biological substrate (e.g., a human or an animal). For example, in some embodiments, the pressure sensitive adhesives of the present disclosure may be used to adhere medical substrates to the skin of humans and/or animals. Exemplary medical substrates include polymeric materials, plastics, natural macromolecular materials (e.g., collagen, wood, cork, and leather), paper, wovens, nonwovens, metals, glass, ceramics, and composites. In particular embodiments, the medical substrate is a hydrophilic thermoplastic polyurethane film commercially available from Lubrizol (Wickliffe, OH) under the trade designation ESTANE, such that a wound dressing article is provided.

Methods of Controlling Optical Properties

Also disclosed herein are methods of controlling optical properties of a pressure sensitive adhesive layer, the method including combining silicone elastomer, acrylate monomer, initiator, solvent and a compatibilizer to form a coating composition, wherein the identity of the compatibilizer, one or more properties of the compatibilizer, the quantity of the compatibilizer, or a combination thereof can be chosen in order to control the optical properties of the pressure sensitive adhesive.

Various factors can be controlled in order to control or choose optical properties of the pressure sensitive adhesive layer. For example, the identity of the compatibilizer, one or more properties of the compatibilizer, the quantity of the compatibilizer, or a combination thereof can be ILLUSTRATIVE EMBODIMENTS With various aspects of the compositions, articles and methods being described, various illustrative combinations are also described to further illustrate various combinations that are useful in certain applications, some of which are described herein. As used herein, "any one of the X embodiments is included" refers to including any one of the embodiments including the designation X (e.g., any one of the A embodiments refers to embodiments A, A1, A2, A5a, etc. and any one of the A5 embodiments refers to embodiments A5, A5a, A5b, etc.).

In illustrative embodiment A, a phase separated article includes a matrix phase; and a silicone elastomer phase stably dispersed in the matrix phase. The matrix phase includes an acrylate copolymer.

In illustrative embodiment B, a pressure sensitive adhesive article includes a matrix phase and a silicone elastomer phase stably dispersed in the matrix phase. The matrix phase includes an acrylate copolymer.

In illustrative embodiment C, an optical article includes a matrix phase; and a silicone elastomer phase stably dispersed in the matrix phase. The matrix phase includes an acrylate copolymer.

In illustrative embodiment D, a display device includes an organic light emitting diode; and a layer of phase separated article. The layer of phase separated article includes a matrix phase; and a silicone elastomer phase stably dispersed in the matrix phase. The matrix phase includes an acrylate copolymer.

In illustrative embodiment E, a display device includes an organic light emitting diode; and a phase separated pressure sensitive adhesive. The phase separated pressure sensitive adhesive includes a matrix phase; and a silicone elastomer phase stably dispersed in the matrix phase. The matrix phase includes an acrylate copolymer.

In illustrative embodiment F, a method of forming a phase separated article. The method includes preparing a solution polymer by radically copolymerizing a composition comprising functionalized silicone elastomer and acrylate monomers in at least one solvent; forming a film including the solution polymer composition; and drying and curing the film to form the phase separated article.

In illustrative embodiment G, a method of controlling optical properties of a phase separated article. The method includes preparing a solution polymer by radically copolymerizing a composition comprising functionalized silicone elastomer and acrylate monomers in at least one solvent to form a coating composition.

In illustrative embodiment A1, the articles or methods of any one of the A, B, C, D, E, F, or G embodiments is included, wherein the silicone elastomers comprise siloxane polyoxamide elastomers.

In illustrative embodiment A2, the articles or methods of any one of the A, B, C, D, E, F, or G embodiments is included, wherein the silicone elastomers are selected from silicone polyoxamide-type block copolymers.

In illustrative embodiment A3, the articles or methods of any one of the A, B, C, D, E, F, or G embodiments is included, wherein the silicone elastomers have an inherent viscosity (IV) of at least 0.5.

In illustrative embodiment A4, the articles or methods of any one of the A, B, C, D, E, F, or G embodiments is included, wherein the silicone elastomers have an IV of at least 0.8.

In illustrative embodiment A5, the articles or methods of any one of the A, B, C, D, E, F, or G embodiments is included, wherein the silicone elastomers have an IV of not greater than 2.8.

In illustrative embodiment A6, the articles or methods of any one of the A, B, C, D, E, F, or G embodiments is included, wherein the silicone elastomers have an IV of not greater than 1.2.

In illustrative embodiment A7, the articles or methods of any one of the A, B, C, D, E, F, or G embodiments is included, wherein the silicone elastomer phase has an average domain size of not less than 1 micrometer (μm).

In illustrative embodiment A8, the articles or methods of any one of the A, B, C, D, E, F, or G embodiments is included, wherein the silicone elastomer phase has an average domain size of not less than 2 micrometer (μm).

In illustrative embodiment A9, the articles or methods of any one of the A, B, C, D, E, F, or G embodiments is included, wherein the silicone elastomer phase has an average domain size of not greater than 8 micrometer (μm).

In illustrative embodiment A10, the articles or methods of any one of the A, B, C, D, E, F, or G embodiments is included, wherein the silicone elastomer phase has an average domain size of not greater than 5 micrometer (μm).

In illustrative embodiment A11, the articles or methods of any one of the A, B, C, D, E, F, or G embodiments is included, wherein the matrix phase further comprises one or more compatibilizers or residues thereof.

In illustrative embodiment A11a, the articles or methods of any one of the A11 embodiments is included, wherein the compatibilizer or residue thereof is selected from isocyanatoethyl methacrylate (IEM), PDMS diamines, and combinations thereof.

In illustrative embodiment A11b, the articles or methods of any one of the A11 embodiments is included, the molecular weight of the PDMS diamines are from 500 g/mol to 100,000 g/mol.

In illustrative embodiment A11c, the articles or methods of any one of the A11b embodiments is included, wherein the molecular weight of the PDMS diamines are from 10,000 g/mol to 50,000 g/mol.

In illustrative embodiment A11d, the articles or methods of any one of the A11b embodiments is included, wherein the molecular weight of the PDMS diamines are from 20,000 g/mol to 35,000 g/mol.

In illustrative embodiment B1, the article of the B embodiment is included, wherein the article has a thickness from 10 to 30 micrometers.

In illustrative embodiment D1, the article of the D embodiment is included, further comprising optically clear adhesives, circular polarizer, touch sensors, cover glass, or combination thereof.

In illustrative embodiment C1, the article of the C embodiment is included, having an off-axis color shift (0-45°) that is at least 5% better than an off-axis color shift compared to a display device that includes a non-diffusive optically clear adhesive in place of the polymeric film.

In illustrative embodiment C1a, the article of the C1 embodiment is included, having an off-axis color shift (0-60°) that is at least 5% better than an off-axis color shift compared to a display device that includes a non-diffusive optically clear adhesive in place of the polymeric film.

In illustrative embodiment C2, the article of any one of the C embodiments is included, wherein the device is flexible or rigid.

EXAMPLES

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

Materials

TABLE 1

Listed of materials used for making examples

| Name | CAS No. | Supplier |
|---|---|---|
| Isooctyl acrylate (IOA) | 29590-42-9 | 3M |
| Acrylamide (ACM) | 79-06-1 | Zhibo |
| Vinyl acetate (VOAc) | 108-05-4 | Celanese |
| 2-Isocyanatoethylmethcacrylate (IEM) | 30674-80-7 | Brook-Chem. Inc |
| Polydiorganosiloxane polyoxamide elastomer | Made as described below | |
| Oligo-silicone diamine | Made as described below | |
| 1,1'-Azobis(cyclohexanecarbonitrile) (Vazo-67) | 13472-08-7 | DuPont |
| Ethyl acetate (EtOAc) | 141-78-6 | Honeywell |
| Methanol (MeOH) | 67-56-1 | VWR |
| RF02N Liner | Silicone coated polyester release liner | SKC Haas (Cheonan, Korea) |
| RF12N Liner | Silicone coated polyester release liner | SKC Hass (Cheonan, Korea) |

Polydiorganosiloxane polyoxamide elastomer: The polydiorganosiloxane polyoxamide elastomer was prepared as described in Example 12 of U.S. Pat. No. 8,765,881 (the disclosure of which is incorporated herein by reference thereto) except that the diamine had a molecular weight of about 20,000 grams/mole (or an amine equivalent weight of about 10,000 grams/mole). The final elastomer composition contained 30.0% solids.

Oligo-silicone diamine: The oligo-silicone diamine was prepared as described in Example 2 of WO 95/03354 (the disclosure of which is incorporated herein by reference thereto).

Test Methods

Optical Property Test Methods: Bulk Haze, Transmission, Clarity

Basic optical properties including transmission, bulk haze, and clarity values were measured using a Haze-Guard Plus haze meter (commercially available from BYK-Gardner, Columbia, MD).

OLED Test Method 1

The angular color of a strong-cavity OLED device, commonly used in mobile phones, has a blue shift as the viewing angle increases. This effect is commonly referred to as off-angle color shift or angular color non-uniformity.

As a figure of merit for the off-angle color shift, it is common to represent the color shift from the corresponding shift in CIE (Commission on Illumination) color coordinates. The CIE color coordinates (u,v) are measures for differing angles and the metric for color shift can be represented by delta_u'v' as expressed in equation A.

$$\text{delta}\_u'v' = \{[u'(\theta)-u'(0)]^2 + [v'(\theta)-v'(0)]^2\}^{.5}; \quad (A)$$

The sample measurement method for OLED color shift utilized a Samsung S5 OLED mobile phone; the same Samsung S5 was used as the testbed for each of the diffuse adhesive samples in the comparison. One intended use of the moderately diffusing polymeric film is to incorporate into the OLED layers, preferably directly above the OLED pixels or above the TFE layer (thin film encapsulation). For this test, however, it is considered equivalent to measure color shifts and brightness with the polymeric film samples placed proximate but outside of the OLED device assembly. More specifically, samples were placed immediately above the touch panel display.

After mounting the samples onto the OLED device assembly, a blank white image was then displayed on the OLED screen. Next, the OLED panel assembly was mounted on a rotation stage to enable angular adjustment relative to the measuring spectrophotometer. For this test system, a PR650 spectrophotometer (PhotoResearch Inc., Syracuse, NY) was used to measure the color and luminance intensity of the testing assembly at every 5 degree incremental rotation angle.

OLED Device Test Method 2

After mounting the samples onto the OLED device assembly, a blank white image was then displayed on the OLED screen. Next, the OLED panel assembly was mounted on a rotation stage to enable angular adjustment relative to the measuring spectrophotometer. For this test system, a PR650 spectrophotometer (PhotoResearch Inc., Syracuse, NY) was used to measure the color and luminance intensity of the testing assembly at every 5 degree incremental rotation angle.

Figure 6:
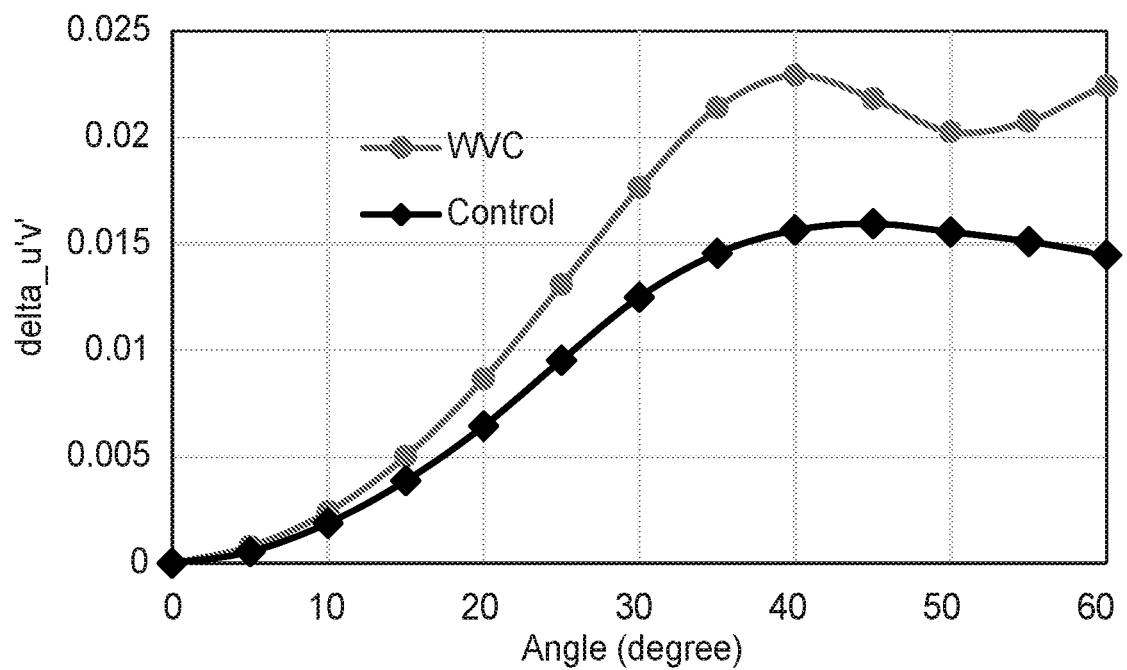
FIG. 6 is a plot of color shift as a function of angle for the control device in combination with the device with a color improvement layer.

For each sample in this evaluation, the angular color shift (delta_u'v') of the OLED device with a Wide View Color (WVC) correction polymeric film was plotted and compared to the same OLED without a WVC correction polymeric film (control). An exemplary plot is shown in FIG. 6. The WVC correction polymeric film helps to substantially reduce the angular color shift of the OLED device. The maximum color shift from 0-45 degrees was reduced from delta_u'v'=0.023 (control) to delta_u'v'=0.016 (with polymeric film), representing a 30% reduction.

Making the In-Situ Phase Separated Polymer Solutions

Phase Separated Polymer Solutions 1-4:

Solutions 1-4 are following the same procedures, except the weight percent of the polydiorganosiloxane polyoxamide elastomer varies from 5% to 17.5% (Table 1). Solution 2 is described as an example in detail. To a reactor was charged 33.0 g of the polydiorganosiloxane polyoxamide elastomer (30% solids in EtOAc). Then 111.9 g ethyl acetate (EtOAc) was added. Mix the two components for 2 hours to obtain a homogenous solution. Then 0.10 g IEM was charged to the reaction, and react at 40° C. for 2 hrs. 15 g methanol (MeOH) was added to reaction and stirred for 20 min. After that, 96 g iso-octyl acrylate (IOA), 4 g acrylamide (ACM) were added and mixed for 2 hours at 40° C. Later, 0.1 g 1,1'-Azobis(cyclohexanecarbonitrile) (Vazo-67) was added to the solution. Oxygen was removed by purging $N_2$ through the solution. Start the polymerization at 55° C., and keep the reaction at 55° C. for 14 hrs. Then the reaction was heated to 65° C., and reaction for 8 more hours. The reaction was diluted to 25% solids by adding 126 g EtOAc and 14 g MeOH.

Solution 5:

To a reactor was charged 49.5 g of the polydiorganosiloxane polyoxamide elastomer (30% solids in EtOAc). Then 167.8 g ethyl acetate (EtOAc) was added. Mix the two components for 2 hours to obtain a homogenous solution. Then 0.05 g IEM was charged to the reaction, and react at 40° C. for 2 hrs. 22.5 g methanol (MeOH) was added to reaction and stirred for 20 min. After that, 130.5 g iso-octyl acrylate (IOA), 4.5 g acrylamide (ACM), and 15 g vinyl acetate (VOAc) were added and mixed for 2 hours at 40° C. Later, 0.15 g 1,1'-Azobis(cyclohexanecarbonitrile) (Vazo-67) was added to the solution. Oxygen was removed by purging $N_2$ through the solution. Start the polymerization at 55° C., and keep the reaction at 55° C. for 14 hrs. Then the reaction was heated to 65° C., and reaction for 8 more hours. The reaction was diluted to 25% solids by adding 184.9 g EtOAc and 20.5 g MeOH.

TABLE 2

Summary of Solution 1-5

| ID | Acrylic | wt % polydiorganosiloxane polyoxamide * | wt % IEM** |
|---|---|---|---|
| Solution 1 | IOA/ACM 96/4 | 5% | 0.1% |
| Solution 2 | IOA/ACM 96/4 | 10% | 0.1% |
| Solution 3 | IOA/ACM 96/4 | 15% | 0.1% |
| Solution 4 | IOA/ACM 96/4 | 17.5% | 0.1% |
| Solution 5 | IOA/ACM/VOAc 87/2/10 | 9% | 0.33% |

* wt % polydiorganosiloxane polyoxamide is calculated to acrylic monomers
** wt % IEM is calculated to acrylic monomers Solution 6:

To a reactor was charged 33.0 g of the polydiorganosiloxane polyoxamide elastomer (30% solids in EtOAc) and 0.99 g oligo(silicone diamine) (neat). Then 111.9 g EtOAc was added. Mix the three components for 2 hours to obtain a homogenous solution. Then 0.005 g IEM was charged to the reaction, and react at 40° C. for 2 hrs. 15 g MeOH was added to reaction and stirred for 20 min. After that, 96 g IOA, 4 g ACM were added and mix for 2 hours at 40° C. Later, 0.1 g Vazo-67 were added to the solution. Oxygen was removed by purging $N_2$ through the solution. Start the polymerization at 55° C., and keep the reaction at 55° C. for 14 hrs. Then the reaction was heated to 65° C., and reaction for 8 more hours. The reaction was diluted to 25% solids by adding 126 g EtOAc and 14 g MeOH.

TABLE 3

Summary of Solution 6

| ID | Acrylic | wt % polydiorganosiloxane polyoxamide * | wt % oligo (silicone diamine) ** | mol % IEM *** |
|---|---|---|---|---|
| Solution 6 | IOA/ACM 96/4 | 10% | 0.1% | 0.5% |

* wt % polydiorganosiloxane polyoxamide is calculated to acrylic monomers
** wt % oligo(silicone diamine) is calculated to acrylic monomers
*** mol % IEM is calculated to oligo(silicone diamine)

Preparation of Component Materials for Examples

Example 1-6

Figure 7:
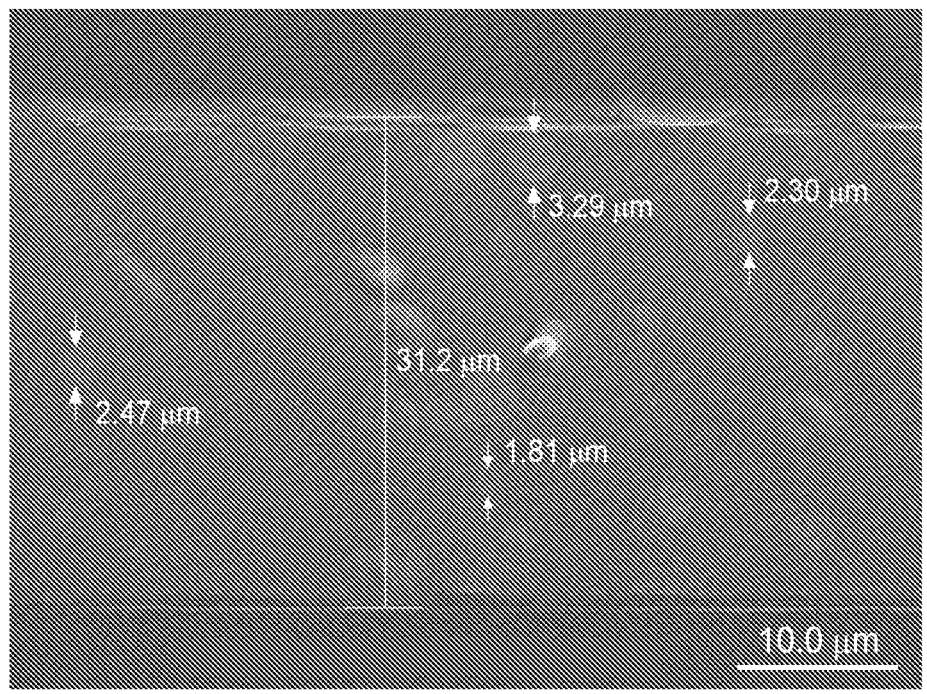
FIG. 7 is a cross-section SEM image for a phase separated film corresponding to example 2.

All the examples 1-6 were prepared through a similar coating process. Example 1 is described in detail. The polymer solution 1 was coated on a moving substrate film RF12N liner at 5 feet/min through a knife coater, the gaps between the knife and release liner RF12N were controlled at 5 mil which controls the thickness of the desired polymer coating, and the web passed two 10 feet long drying oven set temperature around 70° C., after drying, an easier liner of RF02N was laminated on the drying polymer coatings to make a transfer tape construction. FIG. 7 is a representative SEM image from Example 2.

TABLE 4

Summary of coated tape examples

| Examples | Solution used for coating | Thickness | Liners (easy/tight) |
|---|---|---|---|
| Example 1 | Solution 1 | 30 um | RF02N/ RF12N |
| Example 2 | Solution 2 | 30 um | RF02N/ RF12N |
| Example 3 | Solution 3 | 30 um | RF02N/ RF12N |
| Example 4 | Solution 4 | 30 um | RF02N/ RF12N |
| Example 5 | Solution 5 | 30 um | RF02N/ RF12N |
| Example 6 | Solution 6 | 32.5 um | RF02N/ RF12N |

Testing Results
Optical Property Test:

The optical properties including haze, clarity and transmission are tested for all examples. The results are summarized in Table 5. All the examples 1-6 were prepared through a similar coating process.

TABLE 5

Summary of optical properties

| Examples | Haze | Clarity | Transmission |
|---|---|---|---|
| Example 1 | 76.5 | 66.7 | 92.7 |
| Example 2 | 80.2 | 54.8 | 90.6 |
| Example 3 | 85.6 | 36.3 | 89.6 |
| Example 4 | 88.1 | 27.5 | 90.6 |
| Example 5 | 82.5 | 64.7 | 91.7 |
| Example 6 | 31.1 | 99.5 | 92.6 |

OLED Test Method 1:

For each sample in this evaluation, the angular color shift (delta_u'v') of the OLED device with a Wide View Color (WVC) correction polymeric film was measured and listed in the Table 6.

TABLE 6

Summary of the results from OLED test method 1

| Examples | Normalized brightness | delta_u'v' (max @0-45) [ %] | Off-angle color uniformity improvement (%) |
|---|---|---|---|
| Example 1 | 98% | 58% | 42 |
| Example 2 | 95% | 56% | 44 |
| Example 3 | 93% | 48% | 52 |
| Example 4 | 93% | 45% | 55 |
| Example 5 | 95% | 60% | 40 |
| Example 6 | 90% | 75% | 25 |

OLED Device Test Method 2:

Example 5 was also tested in an Apple watch version2 OLED panel. One intended use of the moderately diffusing polymeric film is to incorporate into the OLED layers, preferably directly above the OLED pixels or above the TFE layer (thin film encapsulation).

Figure 8:
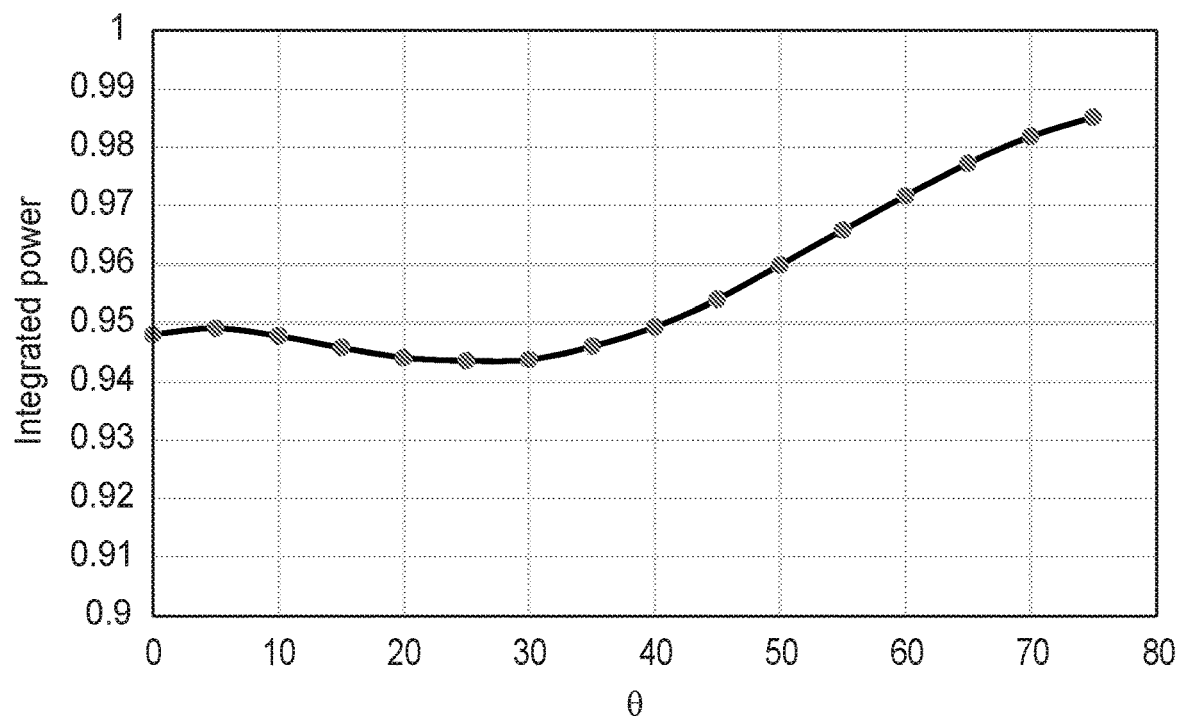
FIG. 8 is plot of angularly integrated power as a function of viewing angle. The plot shows measurement for a device with the color improvement layer, normalized to the control device without color improvement layer.

Although the axial brightness of the OLED device is reduced by about 5% after the integration of the WVC correction polymeric film, the integrated total power has a much lower reduction. The integrated power as a function of the viewing angle integration is shown in FIG. 8. At 75 degree power integration angle, the power reduction is only less than 2%.

Figure 9:
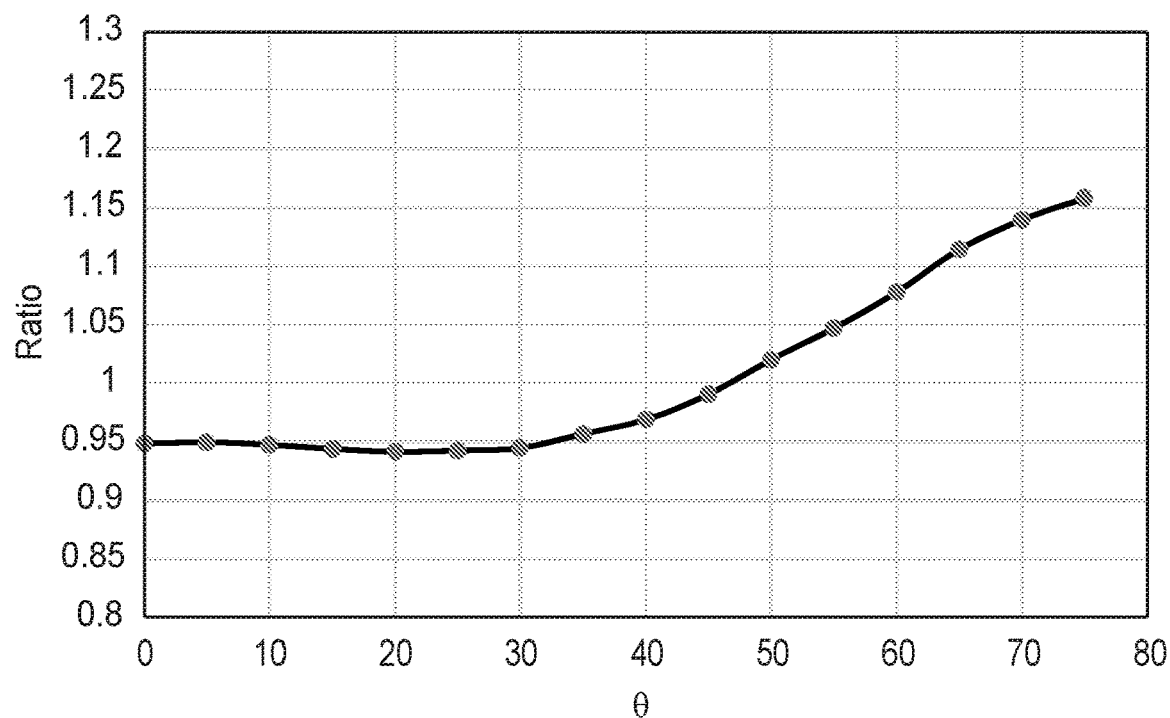
FIG. 9 is plot of the ratio of the brightness for the sample device (with color improvement layer) to the brightness of the control device itself.

A close inspection of the OLED power distribution indicates that the off-axis brightness is actually improved after the integration of the WVC correction polymeric film. The brightness ratio of the OLED panel with and without the WVC correction polymeric film is shown in FIG. 9. The brightness is more than 15% higher with the WVC correction polymeric film at 75 degree viewing angle.

Thus, various embodiments of anti-reflective surface structures are disclosed. Although reference is made herein to the accompanying set of drawings that form part of this disclosure, one of at least ordinary skill in the art will appreciate that various adaptations and modifications of the embodiments described herein are within, or do not depart from, the scope of this disclosure. For example, aspects of the embodiments described herein may be combined in a variety of ways with each other. Therefore, it is to be understood that, within the scope of the appended claims, the claimed invention may be practiced other than as explicitly described herein.

The complete disclosures of the patents, patent documents, and publications cited herein are incorporated by reference in their entirety as if each were individually incorporated. To the extent that there is any conflict or discrepancy between this specification as written and the disclosure in any document that is incorporated by reference herein, this specification as written will control.

What is claimed is:

1. A phase separated article comprising:
    a matrix phase comprising an acrylate copolymer, the matrix phase derived from precursors comprising from 60 to 95 parts by weight of an alkyl acrylate having an alkyl group having 1 to 14 carbon atoms; and
    a silicone elastomer phase stably dispersed in the matrix phase.

2. A display device comprising:
    an organic light emitting diode; and
    a layer of phase separated article according to claim 1 disposed adjacent to the organic light emitting diode.

3. The display device of claim 2 further comprising optically clear adhesives, circular polarizer, touch sensors, cover glass, or combination thereof.

4. The article of claim 1, wherein the silicone elastomers comprise siloxane polyoxamide elastomers.

5. The article of claim 1, wherein the silicone elastomers are selected from silicone polyoxamide-type block copolymers.

6. The article of claim 1, wherein the silicone elastomers have an inherent viscosity (IV) of at least 0.5.

7. The article of claim 1, wherein the silicone elastomers have an IV of at least 0.8.

8. The article of claim 1, wherein the silicone elastomers have an IV of not greater than 2.8.

9. The article of claim 1, wherein the silicone elastomers have an IV of not greater than 1.2.

10. The article of claim 1, wherein the silicone elastomer phase has an average domain size of not less than 1 micrometer (μm).

11. The article of claim 1, wherein the silicone elastomer phase has an average domain size of not less than 2 micrometer (μm).

12. The article of claim 1, wherein the silicone elastomer phase has an average domain size of not greater than 8 micrometer (μm).

13. The article of claim 1, wherein the silicone elastomer phase has an average domain size of not greater than 5 micrometer (μm).

14. The article of claim 1, wherein the matrix phase further comprises one or more compatibilizers or residues thereof.

15. The article of claim 14, wherein the compatibilizer or residue thereof is selected from isocyanatoethyl methacrylate (IEM), PDMS diamines, and combinations thereof.

16. The article of claim 15, wherein the molecular weight of the PDMS diamines are from 500 g/mol to 100,000 g/mol.

17. The article of claim 15, wherein the molecular weight of the PDMS diamines are from 10,000 g/mol to 50,000 g/mol.

18. The article of claim 15, wherein the molecular weight of the PDMS diamines are from 20,000 g/mol to 35,000 g/mol.

19. A pressure sensitive adhesive article, the article comprising a copolymeric material, the copolymeric material comprising:
a matrix phase comprising an acrylate copolymer, the matrix phase derived from precursors comprising from 60 to 95 parts by weight of an alkyl acrylate having an alkyl group having 1 to 14 carbon atoms; and
a silicone elastomer phase stably dispersed in the matrix phase,
wherein the copolymeric material is a pressure sensitive adhesive.

20. A display device comprising:
an organic light emitting diode; and
the pressure sensitive adhesive article of claim 19 disposed adjacent to the organic light emitting diode.

21. The article according to claim 19, wherein the article has a thickness from 10 to 30 micrometers.

22. An optical article, the optical article comprising a copolymeric material, the copolymeric material comprising:
a matrix phase comprising an acrylate copolymer, the matrix phase derived from precursors comprising from 60 to 95 parts by weight of an alkyl acrylate having an alkyl group having 1 to 14 carbon atoms; and
a silicone elastomer phase stably dispersed in the matrix phase,
wherein the copolymeric material is optically clear.

23. The optical article of claim 22 a display device having an off-axis color shift (0-45°) that is at least 5% better than an off-axis color shift compared to a display device that includes a non-diffusive optically clear adhesive in place of the copolymeric material.

24. The optical article of claim 23 an off-axis color shift (0-60°) that is at least 5% better than an off-axis color shift compared to a display device that includes a non-diffusive optically clear adhesive in place of the copolymeric material.

* * * * *

UNITED STATES PATENT AND TRADEMARK OFFICE
CERTIFICATE OF CORRECTION

PATENT NO. : 12,060,502 B2  
APPLICATION NO. : 17/057841  
DATED : August 13, 2024  
INVENTOR(S) : Encai Hao et al.

Page 1 of 1

It is certified that error appears in the above-identified patent and that said Letters Patent is hereby corrected as shown below:

In the Claims

Column 28  
Line 19, In Claim 23, delete "claim 22 a display device" and insert -- claim 22 being a display device --, therefor.  
Line 24, In Claim 24, delete "claim 23 an off-axis" and insert -- claim 23 having an off-axis --, therefor.

Signed and Sealed this  
Eleventh Day of March, 2025

Coke Morgan Stewart  
*Acting Director of the United States Patent and Trademark Office*